(12) United States Patent
Takayanagi et al.

(10) Patent No.: US 7,012,557 B2
(45) Date of Patent: Mar. 14, 2006

(54) RAMP MODULATION ADC FOR IMAGERS

(75) Inventors: Isao Takayanagi, Tokyo (JP); Toshinori Otaka, Chiba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/920,192

(22) Filed: Aug. 18, 2004

(65) Prior Publication Data

US 2006/0028368 A1    Feb. 9, 2006

(30) Foreign Application Priority Data

Aug. 4, 2004    (JP)    ............... 2004-228079

(51) Int. Cl.
*H03M 1/12*    (2006.01)
(52) U.S. Cl. .................................................. 341/155
(58) Field of Classification Search ........... 341/161, 341/162, 163, 169, 170, 155, 118
See application file for complete search history.

(56) References Cited

U.S. PATENT DOCUMENTS

| | | | |
|---|---|---|---|
| 6,545,624 B1 * | 4/2003 | Lee et al. | 341/155 |
| 6,670,904 B1 * | 12/2003 | Yakovlev | 341/167 |
| 6,674,387 B1 | 1/2004 | Ott | |
| 6,885,331 B1 * | 4/2005 | Krymski | 341/169 |
| 2003/0058149 A1 | 3/2003 | Jayadeva | |
| 2004/0034499 A1 | 2/2004 | Regier | |

* cited by examiner

*Primary Examiner*—Brian Young
(74) *Attorney, Agent, or Firm*—Dickstein Shapiro Morin & Oshinsky LLP

(57) ABSTRACT

An imager with a ramp modulation analog-to-digital converter. The ramp modulation analog-to-digital converter uses a ramp generator capable of generating ramp voltages that change by more than one step to reduce the number of steps in the conversion process.

54 Claims, 17 Drawing Sheets

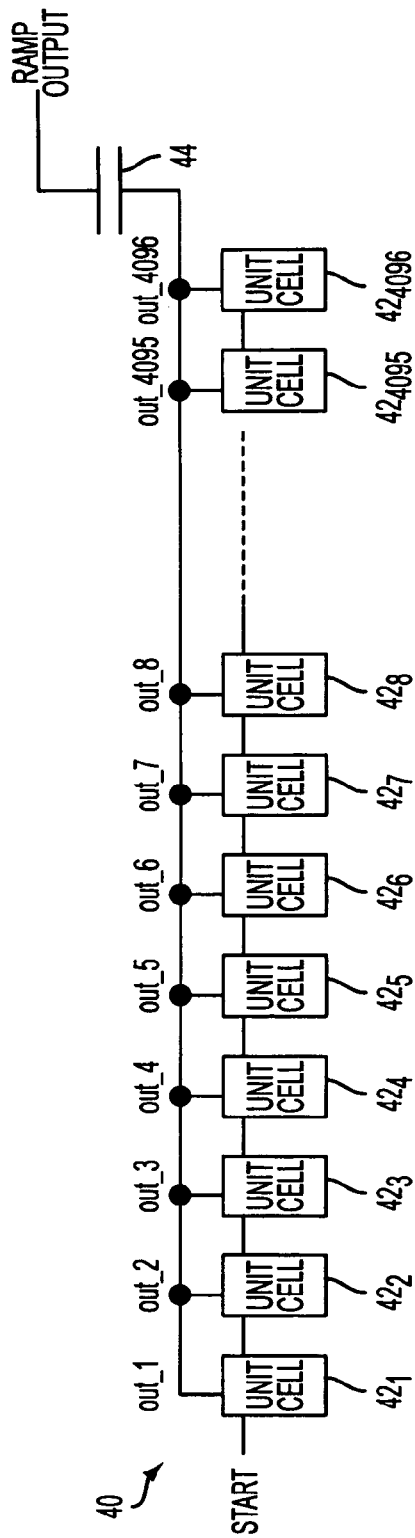
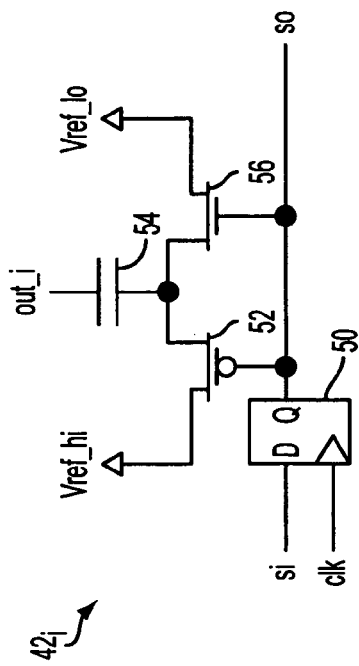
FIG. 2
FIG. 3

| RAMP CODE | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| COLSEL[0] | 1 | 1 | 1 | 1 | 1 | 1 | 1 | 1 | 1 | 1 | 1 | 1 | 1 | 1 | 1 | 1 |
| COLSEL[1] | 0 | 1 | 1 | 1 | 0 | 1 | 1 | 1 | 0 | 1 | 1 | 1 | 0 | 1 | 1 | 1 |
| COLSEL[2] | 0 | 0 | 1 | 1 | 0 | 0 | 1 | 1 | 0 | 0 | 1 | 1 | 0 | 0 | 1 | 1 |
| COLSEL[3] | 0 | 0 | 0 | 1 | 0 | 0 | 0 | 1 | 0 | 0 | 0 | 1 | 0 | 0 | 0 | 1 |
| ROWSEL[0] | 1 | 1 | 1 | 1 | 0 | 0 | 0 | 0 | 0 | 0 | 0 | 0 | 0 | 0 | 0 | 0 |
| LOCK[0] | 0 | 0 | 0 | 0 | 1 | 1 | 1 | 1 | 1 | 1 | 1 | 1 | 1 | 1 | 1 | 1 |
| ROWSEL[1] | 0 | 0 | 0 | 0 | 1 | 1 | 1 | 1 | 0 | 0 | 0 | 0 | 0 | 0 | 0 | 0 |
| LOCK[1] | 0 | 0 | 0 | 0 | 0 | 0 | 0 | 0 | 1 | 1 | 1 | 1 | 1 | 1 | 1 | 1 |
| ROWSEL[2] | 0 | 0 | 0 | 0 | 0 | 0 | 0 | 0 | 1 | 1 | 1 | 1 | 0 | 0 | 0 | 0 |
| LOCK[2] | 0 | 0 | 0 | 0 | 0 | 0 | 0 | 0 | 0 | 0 | 0 | 0 | 1 | 1 | 1 | 1 |
| ROWSEL[3] | 0 | 0 | 0 | 0 | 0 | 0 | 0 | 0 | 0 | 0 | 0 | 0 | 1 | 1 | 1 | 1 |
| LOCK[3] | 0 | 0 | 0 | 0 | 0 | 0 | 0 | 0 | 0 | 0 | 0 | 0 | 0 | 0 | 0 | 0 |

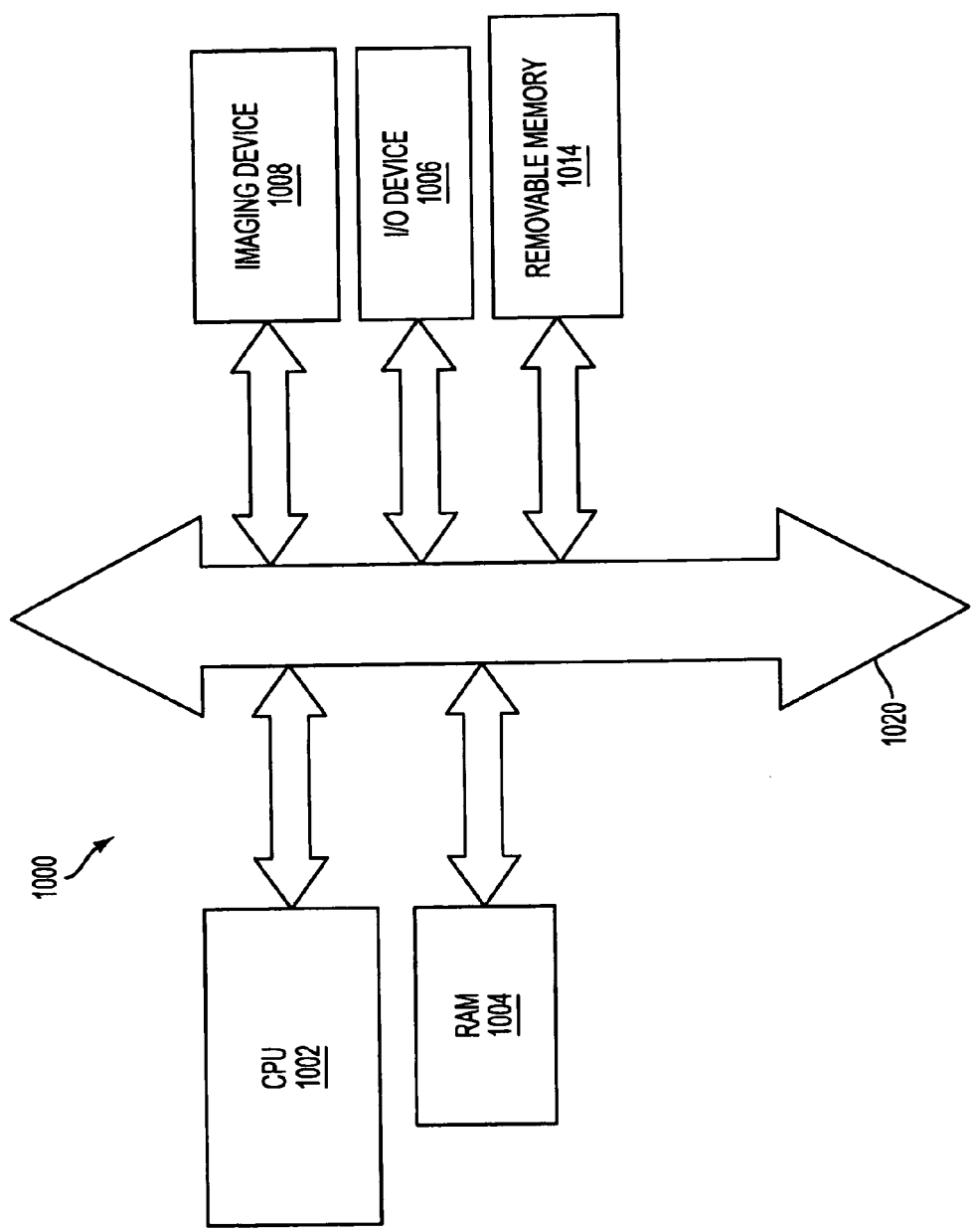

us 7,012,557 B2

RAMP MODULATION ADC FOR IMAGERS

FIELD OF THE INVENTION

The invention relates generally to imaging devices and more particularly to ramp modulation analog-to-digital conversion of analog imaging signals.

BACKGROUND

A CMOS imager circuit includes a focal plane array of pixel cells, each one of the cells including a photosensor, for example, a photogate, photoconductor or a photodiode overlying a substrate for accumulating photo-generated charge in the underlying portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the necessary functions of: (1) photon to charge conversion; (2) accumulation of image charge; (3) resetting the storage region to a known state before the transfer of charge to it; (4) transfer of charge to the storage region accompanied by charge amplification; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

A typical four transistor (4T) CMOS imager pixel 10 is shown in FIG. 1. The pixel 10 includes a photosensor 12 (e.g., photodiode, photogate, etc.), transfer transistor 14, floating diffusion region FD, reset transistor 16, source follower transistor 18 and row select transistor 20. The photosensor 12 is connected to the floating diffusion region FD by the transfer transistor 14 when the transfer transistor 14 is activated by a transfer gate control signal TX.

The reset transistor 16 is connected between the floating diffusion region FD and an array pixel supply voltage Vaa_pix. A reset control signal RST is used to activate the reset transistor 16, which resets the floating diffusion region FD to the array pixel supply voltage Vaa_pix level as is known in the art.

The source follower transistor 18 has its gate connected to the floating diffusion region FD and is connected between the array pixel supply voltage Vaa_pix and the row select transistor 20. The source follower transistor 18 converts the charge stored at the floating diffusion region FD into an electrical output voltage signal Vout. The row select transistor 20 is controllable by a row select signal SEL for selectively connecting the source follower transistor 18 and its output voltage signal Vout to a column line 22 of a pixel array.

The signals output from the pixel 10 are analog voltages. The output signals must be converted from analog to digital for further processing. Thus, the pixel output signals are usually sent to an analog-to-digital converter (ADC) (not shown in FIG. 1). Many CMOS image sensors use a ramp analog-to-digital converter, which is essentially a comparator and associated control logic. In the conventional ramp analog-to-digital converter, an input voltage of the signal to be converted is compared with a gradually increasing reference voltage. The gradually increasing reference voltage is generated by a digital-to-analog converter (DAC) as it sequences through and converts digital codes into analog voltages. This gradually increasing reference voltage is known as the ramp voltage. In operation, when the ramp voltage reaches the value of the input voltage, the comparator generates a signal that latches the digital code of the DAC. The latched digital code is used as the output of the analog-to-digital converter.

Ramp analog-to-digital converters are typically made up of very simple circuits, which results in low power consumption. The problem with ramp analog-to-digital converters is that they must step through, one value at a time, all possible digital values that could be generated and output by the analog-to-digital converter. The typical implementation of a ramp generator for a single slope ramp analog-to-digital converter contains $2^N$ ramp unit cells. FIG. 2 illustrates a portion of a ramp generator 40 for a 12-bit ramp analog-to-digital converter. The ramp generator 40 contains 4096 unit cells $42_1, 42_2, \ldots, 42_{4096}$ (collectively referred to herein as "unit cells 42") having their outputs connected to a capacitor 44 to output a ramp output voltage RAMP OUTPUT. The unit cells 42 are connected in series to form a long shift register.

When the analog-to-digital conversion starts, a logic '1' is loaded into the first unit cell 421. At the next clock edge, the logic '1' in the first unit cell $42_1$ is shifted to the second unit cell $42_2$ while the first unit cell is loaded with a logic '1' once again. At this point, two of the 4096 unit cells 42 are loaded with a logic '1' while the others cells all logic '0' (presuming for example that the initial condition of all the unit cells 42 is to be loaded with a logic '0'). Meanwhile, the outputs OUT_1, OUT_2, . . . , OUT_4096 of the cells 42 are applied to the capacitor 44 to form the ramp output RAMP OUT. This operation continues until all 4096 unit cells are loaded with '1'. Thus, the ramp generation process requires 4096 clock cycles (i.e., $2^N$ cycles) to complete the analog-to-digital conversion.

FIG. 3 illustrates a typical ramp unit cell $42_i$ used in the generator 40 of FIG. 2. The unit cell $42_i$ includes a D flip-flop 50, two transistors 52, 56 and a capacitor 54. The input of the flip-flop 50 receives a shifted input bit Si. The output Q of the flip-flop 50 is connected to the gates of the transistors 52, 56 and is also passed to the next cell (not shown) as a shifted output So. The terminals of the first transistor 52 are connected between a high reference voltage Vref_hi and the capacitor 54. The terminals of the second transistor 56 are connected between a low reference voltage Vref_lo and the capacitor 54.

In operation, for each clock cycle CLK, an output voltage OUT_i is generated from the cell $42_i$. As shown in FIG. 2, each output OUT_i is combined at the capacitor 44 to form the ramp output RAMP OUT.

In principle, the number of ramp operation cycles $N_{RAMP}$ can be expressed as $N_{RAMP}=2^N$, where N is the data resolution of the imager (or analog-to-digital converter) in number of bits. For example, if an imager has a 12-bit resolution, then a 12-bit ramp analog-to-digital converter must be used to obtain the correct digital output. For 12-bit ramp analog-to-digital converters there may be 4,096 steps in any single conversion cycle to ensure that the input voltage is converted to the appropriate digital code (one of 4,096 possibilities). Likewise, for a 10-bit ramp analog-to-digital converter, there may be 1,024 steps in any single conversion cycle. Presuming, for example, that the comparator operating frequency is 100 MHz, the conversion takes approximately 1/100 kHz and 1/25 kHz for 10-bit and 12-bit resolutions, respectively. These are long conversion periods, which increase by a factor of two for every additional bit of resolution in the sensor (or the analog-to-digital converter).

Since it is desirable to increase the resolution of CMOS image sensors, it is desirable to decrease the number of steps in the analog-to-digital conversion cycle. Accordingly, there is a desire and need for an analog-to-digital converter that substantially decreases the analog-to-digital conversion time in an imager that uses ramp analog-to-digital converters.

In addition, it is known that most natural signals have quantum fluctuation. For example, for an average number of incident photons $N_{photon}$, there is a fluctuation with a deviation of approximately $\sqrt{N_{photon}}$, such that the corresponding signal-to-noise ratio (S/N) is limited to:

$$S/N = N_{photon}/\sqrt{N_{photon}} = \sqrt{N_{photon}}. \quad (1)$$

This type of noise is often referred to as "shot noise" and occurs in most charge detection devices such as e.g., imager pixels. For an average number of integrated electrons $N_{ele}$ in a pixel there should be a shot noise component of $\sqrt{N_{ele}}$. This means that the bits in an analog-to-digital conversion output that are below the level of $\sqrt{N_{ele}}$ are not really meaningful. Thus, there is a need and desire to incorporate shot noise into the analog-to-digital conversion process used in today's imagers to increase the accuracy and speed of the conversion.

SUMMARY

The invention provides an analog-to-digital converter that substantially decreases the analog-to-digital conversion time in an imager that uses ramp analog-to-digital converters.

The invention also provides an analog-to-digital converter that preserves signal quality even in the decreased conversion time for photo signal detection purposes.

The above and other features and advantages are achieved in various exemplary embodiments of the invention by providing an imager with a ramp modulation analog-to-digital converter. The ramp modulation analog-to-digital converter uses a ramp generator capable of generating ramp voltages that change by more than one step to reduce the number of steps in the conversion process to improve the accuracy of the conversion.

In one embodiment, the ramp generator uses a digital controller to control the generation of the necessary ramp voltages.

In other embodiments, the analog-to-digital converter accounts for shot noise and/or noise margins and offsets in the analog-to-digital conversion process.

BRIEF DESCRIPTION OF THE DRAWINGS

The foregoing and other advantages and features of the invention will become more apparent from the detailed description of exemplary embodiments provided below with reference to the accompanying drawings in which:

FIG. 2 illustrates a portion of a conventional ramp generator for a single slope ramp analog-to-digital converter;

FIG. 3 illustrates a unit cell used in the generator illustrated in FIG. 2;

FIG. 27 shows a processor system incorporating at least one imager constructed in accordance with an embodiment of the invention.

DETAILED DESCRIPTION

The invention utilizes a ramp modulation analog-to-digital conversion technique to speed up the operation of the analog-to-conversion process in an imager. That is, instead of incrementing the ramp step by one digital value of a digital code (referred to herein as an "LSB"), the ramp step is modulated such that the bit resolution decreases when the analog signal becomes large. That is, the ramp step width encompasses more than one LSB.

Figure 1:
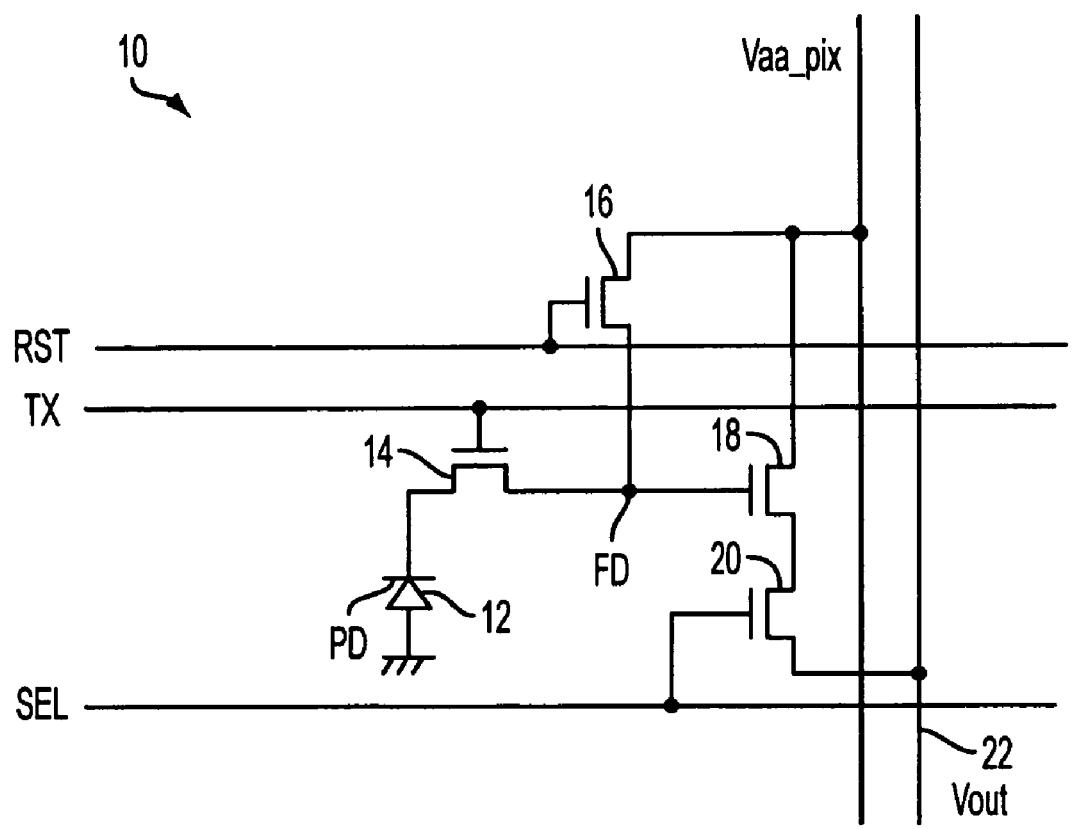
FIG. 1 illustrates a conventional imager pixel circuit.
Figure 4:
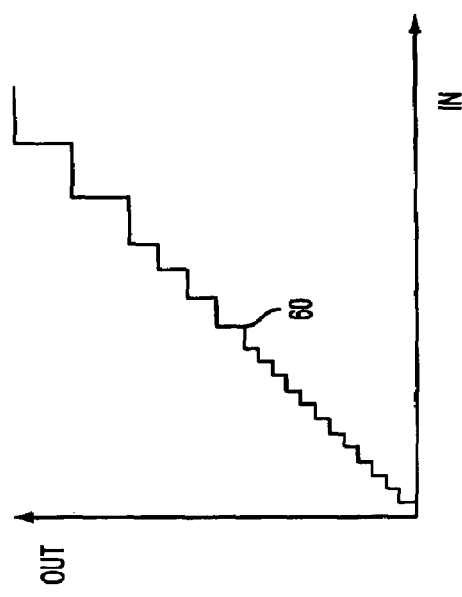
FIG. 4 is a graph illustrating exemplary ramp steps in a ramp modulation analog-to-digital converter.

FIG. 4 is a graph illustrating ramp steps 60 in a ramp modulation analog-to-digital converter. As the input signal IN increases, the width of the steps 60 for the output OUT increases (discussed below in more detail). By increasing the ramp step width (i.e., decreasing the resolution of the analog-to-digital conversion), it is possible to speed up the analog-to-digital conversion process by reducing the number of conversion steps while keeping a good linearity characteristic in e.g., a high frame rate imager.

Figure 5:
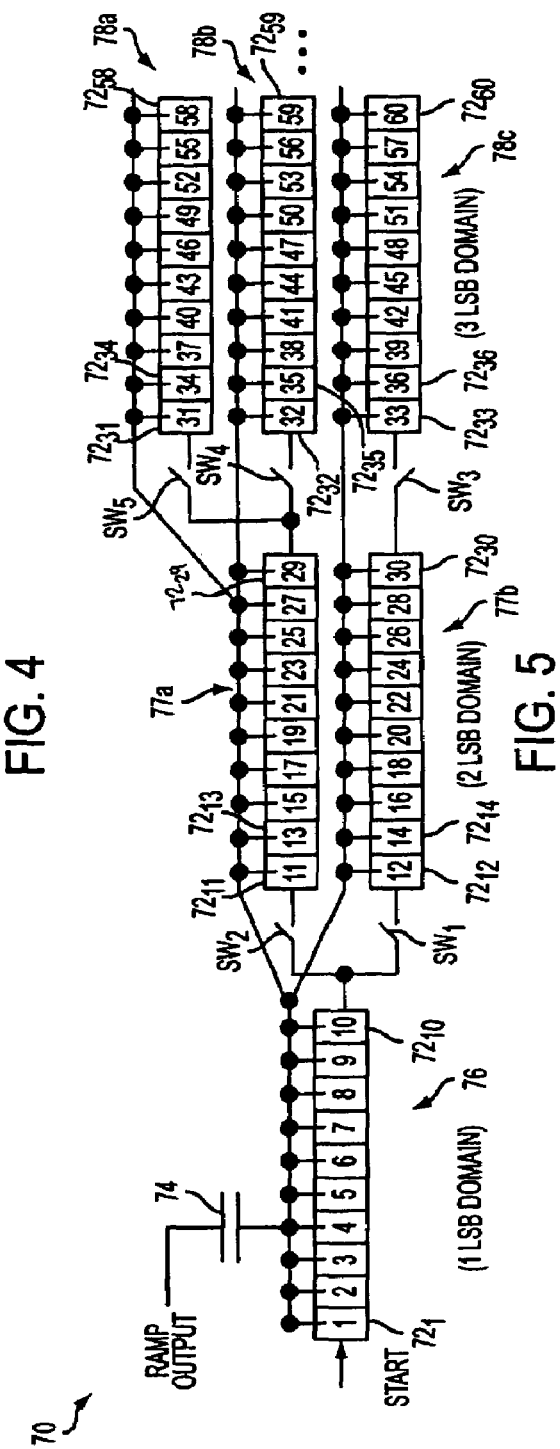
FIG. 5 illustrates a portion of ramp generator for a ramp modulation analog-to-digital converter.

Ramp modulation requires a square root curve to reflect the photon shot noise characteristics of the analog signals. As such, ramp modulation requires the register-type ramp generator 40 (FIG. 2) to be restructured. FIG. 5 illustrates a portion of ramp generator 70 for a ramp modulation analog-to-digital converter. The ramp generator 70 uses several transfer switches $SW_1, SW_2, SW_3, SW_4, SW_5$ to reshape the shifting path or pass through the generator 70 such that the pass through the generator 70 roughly approximates the required ideal square root curve.

In the illustrated generator 70, 4096 unit cells (collectively referred to as "unit cells 72") are organized into groups of ten unit cells 72. FIG. 5 illustrates six groups 76, 77a, 77b, 78a, 78b, 78c. The first group 76 includes unit cells $72_1, \ldots, 72_{10}$. The second group 77a includes unit cells $72_{11}, 72_{13}, \ldots, 72_{29}$. The third group 77b includes unit cells $72_{12}, 72_{14}, \ldots, 72_{30}$. The fourth group 78a includes unit cells $72_{31}, 72_{34}, \ldots, 72_{58}$. The fifth group 78b includes unit cells $72_{32}, 72_{35}, \ldots, 72_{59}$. The sixth group 78c includes unit cells $72_{33}, 72_{36}, \ldots, 72_{60}$. The first group 76 represents the one LSB domain, which means that the ramp step width is only one LSB wide. The second and third groups 77a, 77b represent the two LSB domain, which means that the ramp step width is two LSBs wide. The fourth, fifth and sixth groups 78a, 78b, 78c represent the three LSB domain, which means that the ramp step width is three LSBs wide.

Within each group 76, 77a, 77b, 78a, 78b, 78c, the unit cells 72 are connected in series. The output of each group 76, 77a, 77b, 78a, 78b, 78c is connected to one of the switches SW1, SW2, SW3, SW4, SW5 to change the shifting path to the subsequent groups. For example, after ten clock cycles the shifting enters the two LSB domain and the ramp width goes up by 2 per shift (e.g. unit cells $72_{12}$->$72_{14}$-> . . . -> $72_{30}$). After twenty clock cycles, the shifting enters the three LSB domain and the ramp width goes up by three per shift (e.g. unit cells $72_{33}$->$72_{36}$-> . . . ->$72_{60}$).

If more than one square root curve is required, more transfer switches SW1, etc. are required to selectively change the feeding paths, which may become unnecessarily complicated. In addition, the configuration of the switches (and the generator 70 in general) results in an approximation of the required square root curve. The approximation, however, may reduce the accuracy of the generator, which is not desired.

Figure 6:
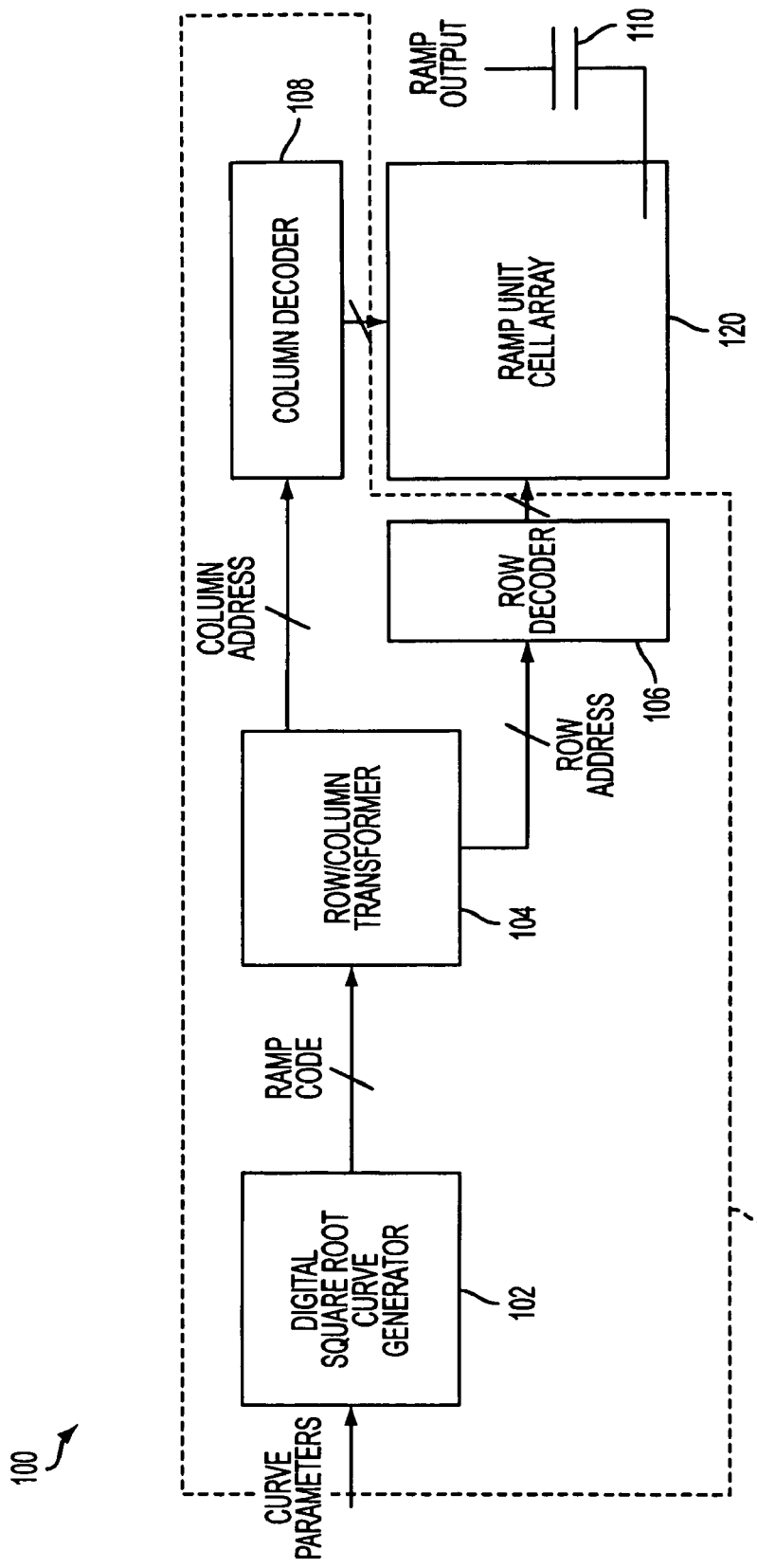
FIG. 6 illustrates an exemplary ramp generator for a ramp modulation analog-to-digital converter constructed in accordance with an embodiment of the invention.

FIG. 6, however, illustrates an exemplary ramp generator 100 constructed in accordance with an embodiment of the invention that overcomes the shortcomings described above. The generator 100 of the invention provides a simple circuit implementation that allows ramp modulation without the shortcomings associated with the generated number of required square root curves. The generator 100 includes a digital controller 101 comprised of a digital square root curve generator 102, a row/column transformer 104, row decoder 106 and column decoder 108. The controller 101 controls a ramp unit cell array 120 such that the array 120 generates a ramp output RAMP OUTPUT (via a capacitor 110). The operation of the generator 100 is described in more detail below.

Figure 7:
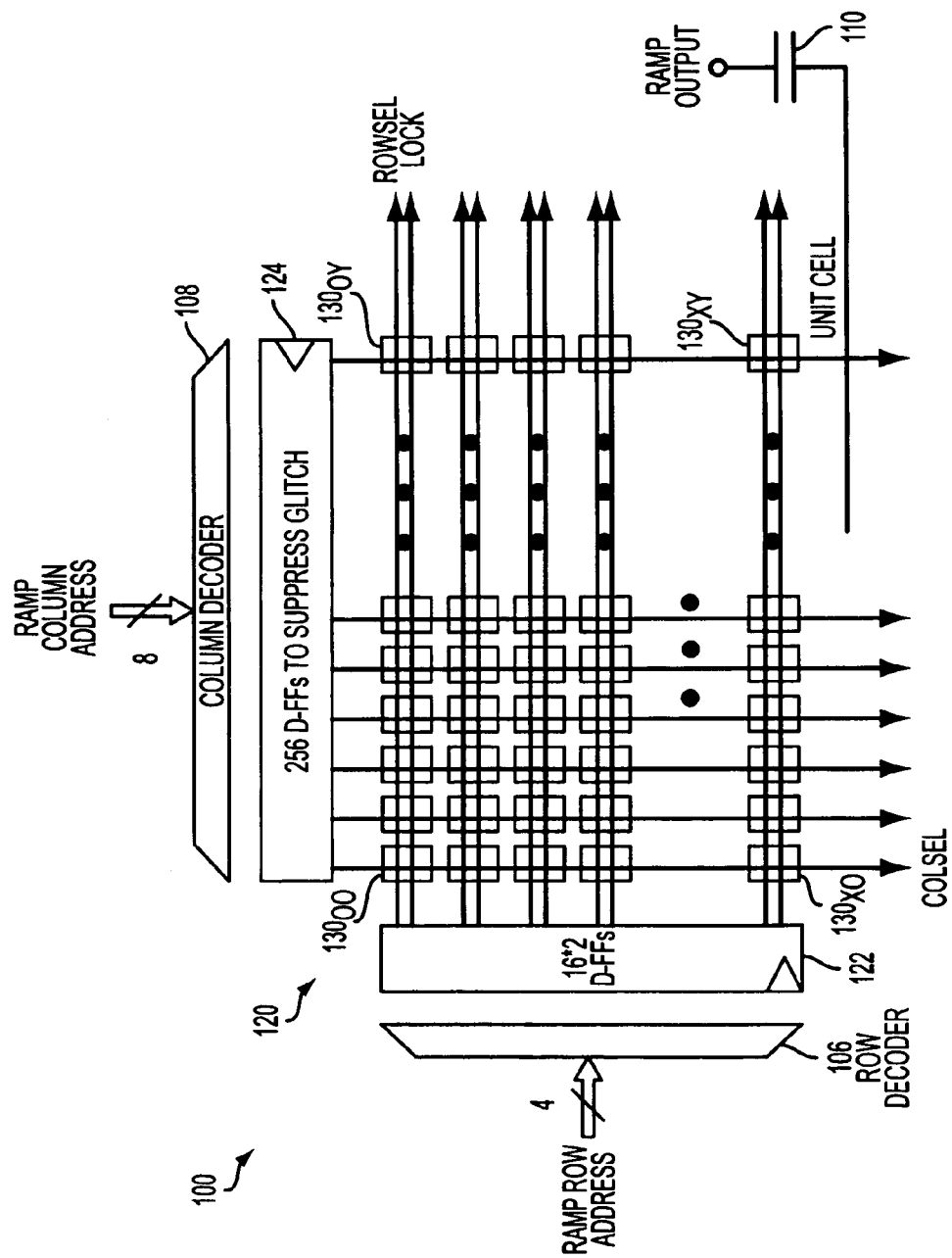
FIG. 7 illustrates a portion of the exemplary ramp generator illustrated in FIG. 6.

FIG. 7 illustrates a portion of the exemplary ramp generator 100 of FIG. 6. As can be seen, the array 120 contains a plurality unit cells $130_{00}, \ldots, 130_{0y}, \ldots, 130_{x0}, \ldots, 130_{xy}$ (collectively referred to as "unit cells 130"). The row decoder 106 is connected to 16×2 D flip-flops 122. The column decoder 108 is connected to 256 D flip-flops 124. The unit cells 130 (described in more detail below with respect to FIG. 9) do not contain flip-flops. Thus, the illustrated generator 100 does not require $2^N$ flip-flops to generate the required ramp steps. Instead, a minimum number of flip-flops 122, 124 are used to latch decoded row/column address signals into the array 120. These flip-flop circuits 122, 124 suppress unwanted and hazardous spike noise.

It should be appreciated that the invention has a flexible topology where the ramp unit cell array 120 may be configured into an arbitrary number of rows and columns. This flexibility is beneficial when the layout space for the generator 100 is not square. It should also be noted that the number of flip-flops 122, 124 vary depending upon the number of rows and columns used in the array 120. In the illustrated embodiment, there are 2 rows of 16 flip-flops 122 connected to the row decoder 106 since there are 16 rows in the illustrated array 120. Similarly, there are 256 flip-flops 124 connected to the column decoder 108 since there are 256 columns in the illustrated array 120.

Referring to FIGS. 6 and 7, a ramp code RAMP CODE is generated in the digital square root curve generator 102. The ramp code RAMP CODE is generated based on input desired curve parameters. The row/column transformer 104 inputs the ramp code RAMP CODE and transforms it to a row address ROW ADDRESS and a column address COLUMN ADDRESS.

The row address ROW ADDRESS is input into the row decoder 106. The column address COLUMN ADDRESS is input into the column decoder 108. The row address ROW ADDRESS and column address COLUMN ADDRESS are used by the decoders 106, 108 to generate row select and column select signals, which select individual unit cells 130 within the array. As is discussed below in more detail, the row decoder 106 will also generate a lock signal that is used to select an entire row of units cells 130 when appropriate.

Figure 8:
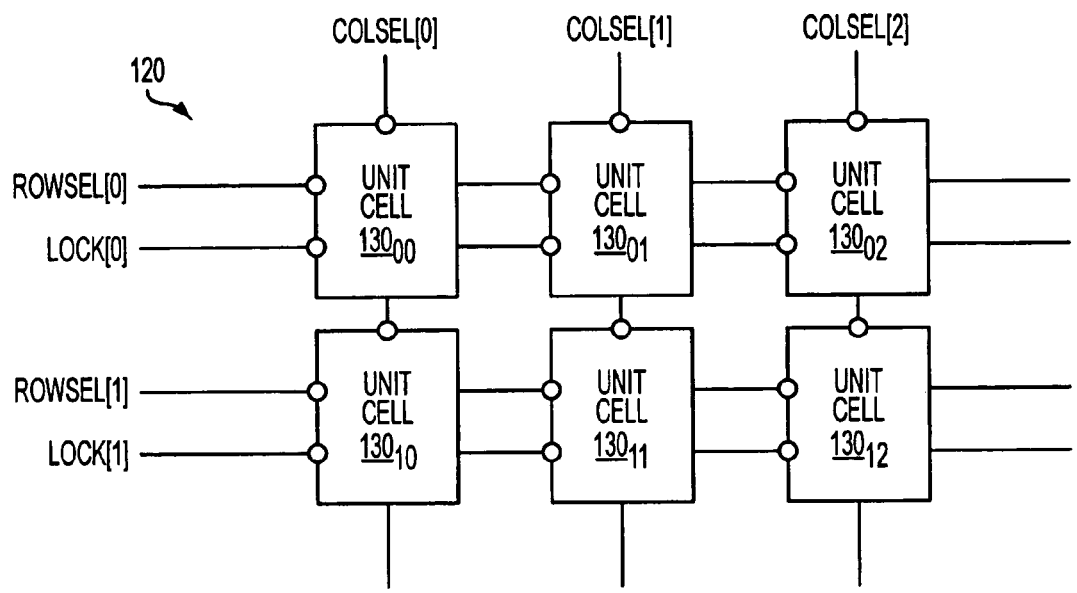
FIG. 8 illustrates a ramp unit cell array, used in the generator of FIG. 6, constructed in accordance with an embodiment of the invention.

FIG. 8 illustrates a portion of an exemplary ramp unit cell array 120 constructed in accordance with an embodiment of the invention. FIG. 8 illustrates six unit cells $130_{00}, 130_{01}, 130_{02}, 130_{10}, 130_{11}, 130_{12}$, organized into two rows by three columns. It should be appreciated that FIG. 8 illustrates a small portion of the array 120 and that there are 16 rows by 256 columns in the illustrated embodiment. Moreover, it should be appreciated that the number of rows and columns may vary depending upon the application and the desired resolution of the imager and analog-to-digital converter containing the ramp generator 100.

The first row of unit cells $130_{00}$, $130_{01}$, $130_{02}$ is connected to a first row select line ROWSEL[0] and a first lock line LOCK[0]. The second row of unit cells $130_{10}$, $130_{11}$, $130_{12}$ is connected to a second row select line ROWSEL[1] and a second lock line LOCK[1]. The first column of unit cells $130_{00}$, $130_{10}$ is connected to a first column select line COLSEL[0]. The second column of unit cells $130_{01}$, $130_{11}$ is connected to a second column select line COLSEL[1] and the third column of unit cells $130_{02}$, $130_{12}$ is connected to a third column select line COLSEL[2].

Figure 9:
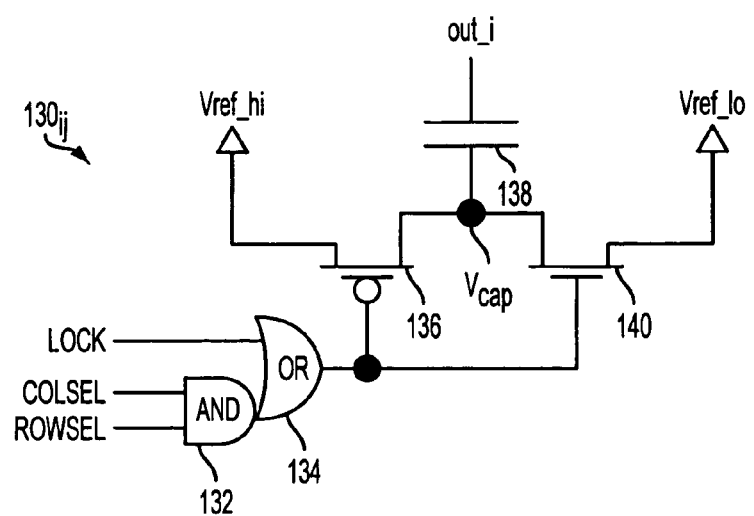
FIG. 9 illustrates an exemplary ramp unit cell used in the FIG. 8 array.

FIG. 9 illustrates an exemplary ramp unit cell $130_{ij}$ used in the ramp unit cell array 120 (FIG. 8). As can be seen in FIG. 9, the D flip-flop 50 used in the conventional unit cell $42_i$ (FIG. 3) is replaced by an AND gate 132 and an OR gate 134. The unit cell $130_{ij}$ also includes two transistors 136, 140 and a capacitor 138. The AND gate 132 inputs the row select ROWSEL and column select COLSEL signals. The output of the AND gate 132 is input into the OR gate 134, which also inputs the lock signal LOCK. The output of the OR gate 134 is connected to the gates of the transistors 136, 140. The terminals of the first transistor 136 are connected between a high reference voltage Vref_hi and the capacitor 138. The terminals of the second transistor 140 are connected between a low reference voltage Vref_lo and the capacitor 140.

In operation, if both the row select ROWSEL and column select COLSEL signals are logic '1', the unit cell $130_{ij}$ is activated, which changes the voltage seen at an internal node Vcap. If the row select signal ROWSEL is logic '1', the column select signal COLSEL is logic '0', and the lock signal LOCK is logic '0', the unit cell $130_{ij}$ is not activated. If the lock signal LOCK is logic '1', the unit cell $130_{ij}$ is activated regardless of the states of the row select ROWSEL and column select COLSEL signals.

The operation of the generator 100 (FIG. 6) is now described. To simplify the description, it is assumed that no ramp modulation is used. Thus, the generated ramp code (from the digital square root curve generator 102) goes from 1 to 4096 in a linear fashion (e.g., the code goes up one by one) and the ramp out RAMP OUTPUT is generated for each code as follows.

Initially, the first row select signal ROWSEL[0] is asserted. For a ramp code equal to '1', the first column select signal COLSEL[0] is asserted. On the next cycle, for a ramp code equal to '2', the second column select signal COLSEL[1] is also asserted (while the first column select signal COLSEL[0] remains asserted). This continues until the ramp code is equal to '256' (i.e., the number of columns in the array 120). For a ramp code equal to '257', the first lock signal LOCK[0] is asserted. This locks the previously activated unit cells 130 in the first row in the activated state. The second row select signal ROWSEL[1] and the first column select signal COLSEL[0] are also asserted at this time to begin activating unit cells 130 in the second row of the array 120. This sequence continues until all 4096 code have been generated.

Figures 10, 11:
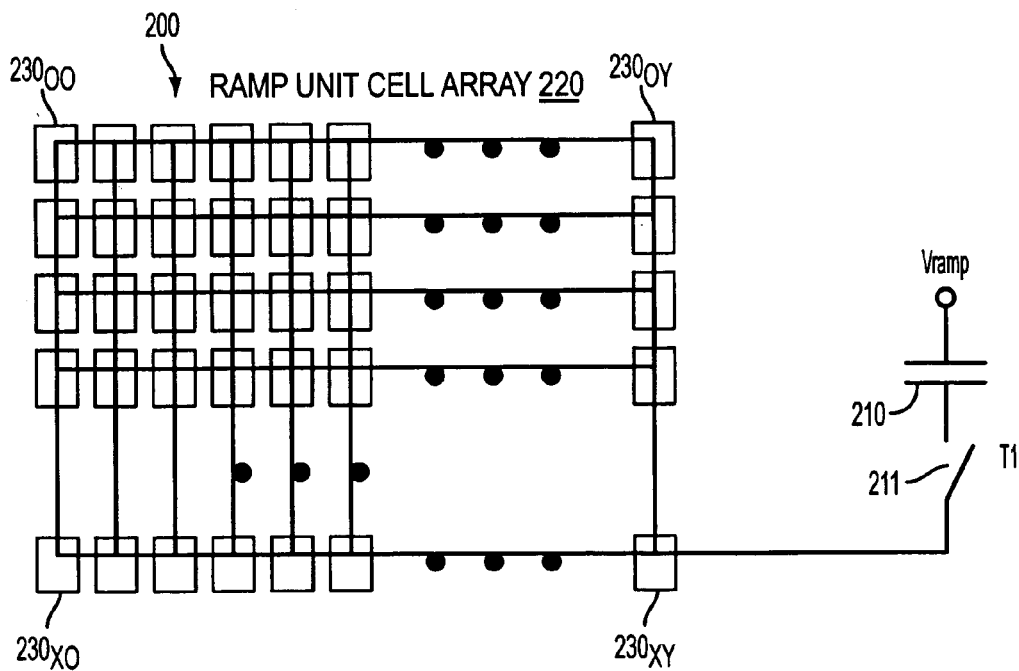
FIG. 10 is a table illustrating an exemplary operation of the ramp generator illustrated in FIG. 6.
FIG. 11 illustrates a portion of another exemplary ramp generator for a ramp modulation analog-to-digital converter constructed in accordance with another embodiment of the invention.

FIG. 10 is a table illustrating an exemplary operation of the ramp generator 100 (FIG. 6). The exemplary table is based on a four row by four column configuration of the unit cell array 120. The same technique is applied to the ramp modulated ramp codes of the invention. The difference between the linear ramp technique and the modulation ramp technique is limited solely to how the ramp code is generated in the digital square root curve generator 102. The key aspect of the method of the invention is to use the lock signal LOCK to lock an entire row of activated unit cells 130 together while additional ramp codes are being processed.

FIG. 11 illustrates a portion of another exemplary ramp generator 200 for a ramp modulation analog-to-digital converter constructed in accordance with another embodiment of the invention. The illustrated embodiment is useful for obtaining the pedestal setting in an imager. Pedestal settings are used to compensate for offsets that may prevent an analog pixel signal from being zero even if there is very little light impinging on the pixel. The analog signal could be more positive, or worse, it could be negative. Because the analog-to-digital converter outputs only positive values, a negative signal will be clipped to zero. To prevent clipping, a positive voltage offset is typically added to signals during the conversion process. The offset voltage is made positive enough to avoid clipping. The resulting analog positive level above the zero value is referred as the pedestal. The pedestal operation is required to detect the blacker-than-black pixels. The pedestal operation ensures the correctness of the low incident light area.

The illustrated generator 200 is essentially the same as the generator 100 shown in FIG. 6. Thus, the generator 200 includes an array 220 of ramp unit cells 230. A switch 211 between the array 220 and the output capacitor 210 is added for the pedestal setting operation. Without the illustrated configuration, a ramp generator would require additional unit cells to achieve the pedestal voltage (e.g., 128 additional unit cells to realize +/−128 LSB). This occurs because once the ramp unit cell shift registers are loaded with a logic '1', they cannot be cleared until an "all-unit-cell-clear signal" (global clear signal) is asserted. The generator 200 of the invention, however, uses the flexible row/column address scheme (described above) and can execute the pedestal operation merely by changing a digital control signal T1.

Figure 12:
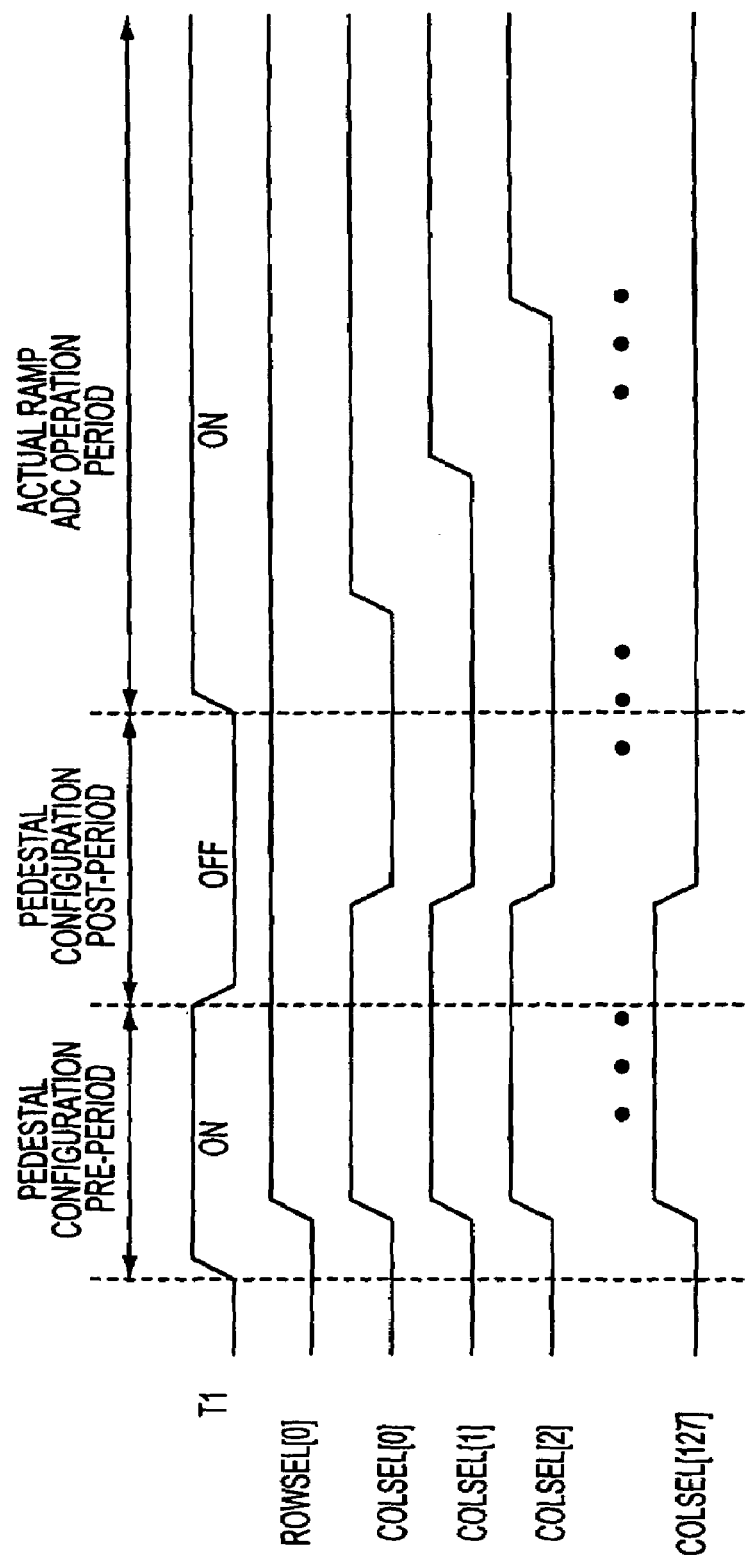
FIG. 12 is a timing diagram of an exemplary operation of the FIG. 11 generator.

FIG. 12 is a timing diagram of an exemplary operation of the FIG. 11 generator 200. The essence of this operation is that the pedestal configuration period is divided into two phases: (1) a pre-period phase; and (2) a post-period phase. In the pre-period phase, the digital control signal T1 is asserted (closing switch 211 and coupling the array outputs to the capacitor 210) so that the pedestal setting is obtained; in this phase, 128 LSBs are programmed (i.e., 128 unit cells are activated simultaneously).

Then, in the post-period phase, the control signal T1 is de-asserted (opening switch 211), which decouples the capacitor 210 from the ramp unit cell array output. After the coupling capacitor 210 is disconnected, all unit cells 130 are cleared (i.e., set to their default state). Then, in the ramp modulation analog-to-digital conversion operational phase, the actual ramp modulation operation (described above) occurs (i.e., unit cells are asserted according to the ramp code generated by the digital square root curve generator 102 and the control signal T1 is asserted to connect the array output to the output capacitor 210).

As such, the pedestal setting operation can be completed in a few cycles whereas other architectures use as many cycles as the desired resolution of the pedestal setting (e.g., 128 cycles are required for a 128 LSB setting).

It should be appreciated that the generators 100, 200 of the invention may incorporate as many curves as desired, without additional circuitry. Moreover, the invention utilizes accurate curves because the digitally generated ramp code is directly converted to row/column addressing. Another benefit of the generators of the invention is that there is a clear segmentation between the analog and digital circuitry and controls. This invention requires less gate area because the number of required flip-flops are reduced to only the number of columns+two times the number of rows.

Figure 13:
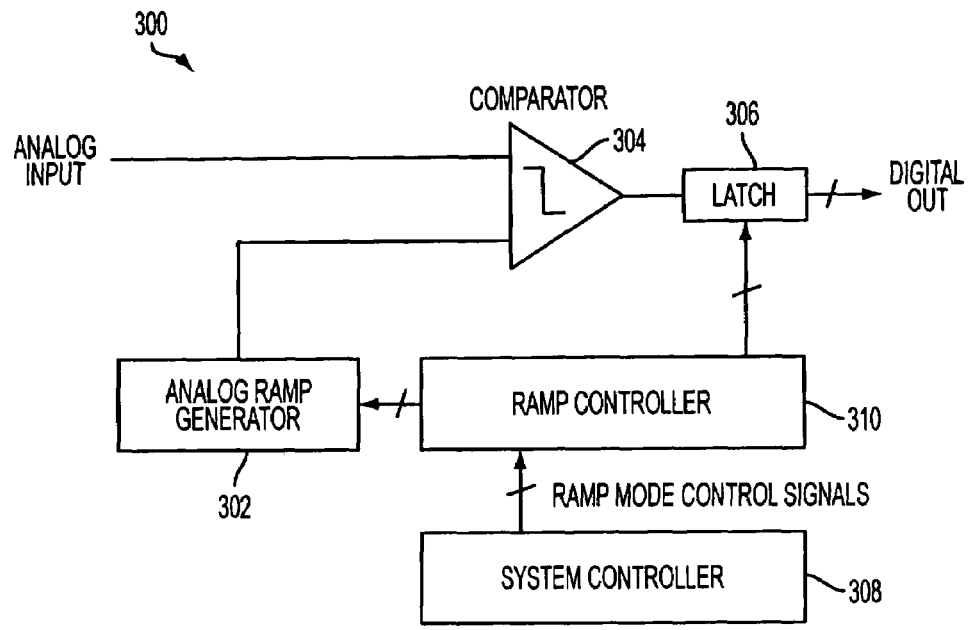
FIG. 13 illustrates a ramp modulation analog-to-digital converter constructed in accordance with another embodiment of the invention.

FIG. 13 illustrates a ramp modulation analog-to-digital converter 300 constructed in accordance with another embodiment of the invention. The converter 300 includes an analog ramp generator 302, a comparator 304, latch 306, system controller 308 and a ramp controller 310.

The system controller 308 controls the ramp controller 310 using information for setting the ramp mode, such as an expected shot noise value or shot noise related inputs and requested analog-to-digital conversion accuracy. The ramp controller 310 chooses or determines a ramping pattern based on the ramp mode control signals received from the system controller 308. The ramp controller 310 generates digital ramp codes while also generating control signals for controlling the analog ramp generator 302. The analog ramp generator 302 outputs an analog ramp voltage that is transferred to one of the input ports of the comparator 304.

The comparator 304 compares the analog ramp voltage to the analog input signal. The comparator 304 flips its output when the analog ramp voltage reaches the level of the an analog input signal. The latch 306 latches the digital ramp code (from the ramp controller 310) when the comparator output flips. The digitally converted output is obtained by reading the digital code stored in the latch 306.

Figure 14:
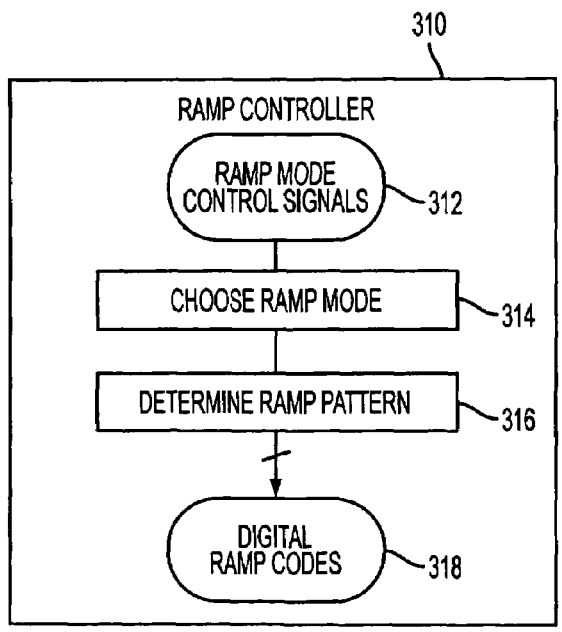
FIG. 14 illustrates processing performed by an exemplary ramp controller, used in the FIG. 13 converter, constructed in accordance with an embodiment of the invention.

FIG. 14 illustrates processing performed by an exemplary ramp controller 310 constructed in accordance with an embodiment of the invention. The ramp controller 310 flexibly reconstructs a ramp pattern within constraints applied from the system controller 308, so that an optimized ramp pattern can be obtained; ramp controller 310 minimizes the ramp steps, which results in the fastest conversion performance possible. The controller 310 inputs the ramp mode control signals (step 312) and uses the signals to choose a ramp mode (step 314). Once the mode is determined, the controller 310 determines the ramp pattern (step 316) and outputs the digital ramp codes (step 318) to the analog ramp generator 302 and latch 306.

Figure 15:
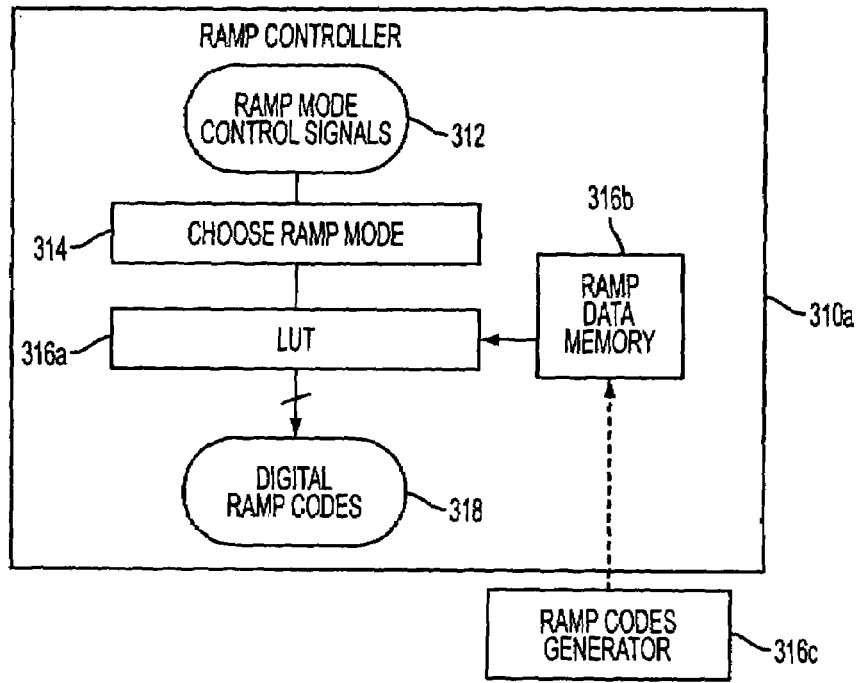
FIG. 15 illustrates processing performed by another exemplary ramp controller, used in the FIG. 13 converter, constructed in accordance with an embodiment of the invention.

FIG. 15 illustrates processing performed by another exemplary ramp controller 310a constructed in accordance with an embodiment of the invention. In the illustrates controller 310a, a look-up-table (LUT) method is used instead of ramp pattern reconstruction method. Expected conditions are assumed, and ramp patterns can be calculated in advance and stored in a look-up-table. In this embodiment, the ramp controller 310a inputs the ramp mode control signals (step 312) and uses the signals to choose a ramp mode (step 314). Previously generated ramp codes (block 316c) are stored in a ramp data memory 316b. The controller 310a uses the ramp mode and the look-up-table to obtain and output the digital ramp codes (steps 316a, 318). It should be appreciated that the illustrated ramp controller 310a is very simple to implement.

Figure 16:
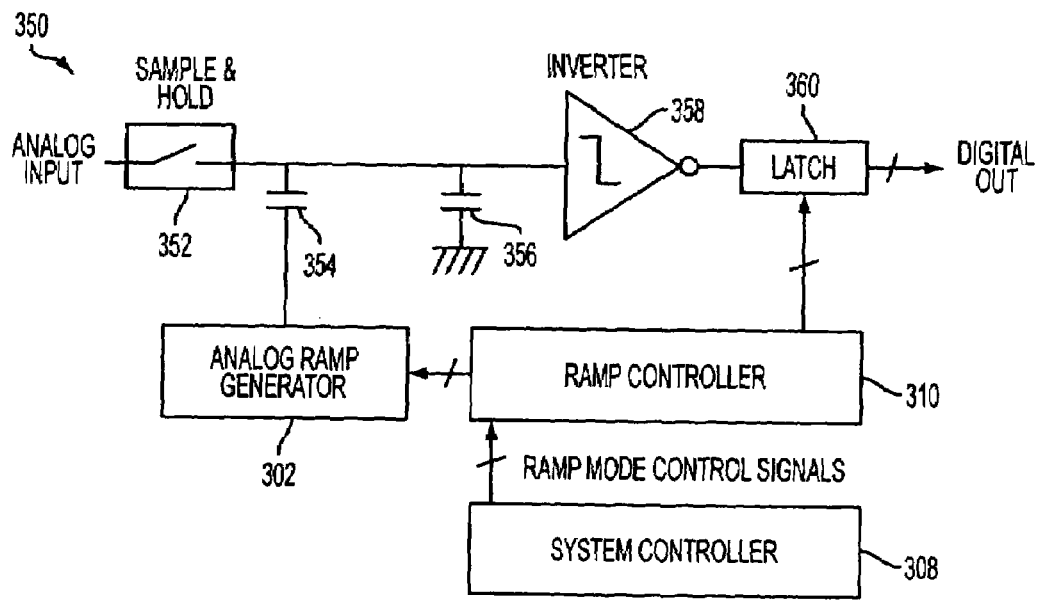
FIG. 16 illustrates another exemplary ramp modulation analog-to-digital converter constructed in accordance with another embodiment of the invention.

FIG. 16 illustrates another exemplary ramp modulation analog-to-digital converter 350 constructed in accordance with another embodiment of the invention. The converter 350 uses a single-ended input comparator 358 (implemented using an inverter) instead of a dual-input comparator 304 as used in the FIG. 13 converter 300. The converter 350 includes a sample and hold switch 352, sample and hold capacitor 354, second capacitor 356, latch 360 as well as the analog ramp generator 302, system controller 308 and ramp controller 310. The illustrated single-end input comparator 358 configuration is often used in image sensors to reduce circuit size and layout space of the sensor. Analog input signal are sampled and held on the first plate of the sample and hold capacitor 354 (when switch 352 is closed). When the voltage of the analog ramp generator 302 causes the difference between the plates of the sample and hold capacitor 354 to be zero, the inverter/comparator 358 output flips. The corresponding digital code used to generate the analog ramp voltage is sent to the latch 360, where the code can be read out (as described above).

Figure 17:
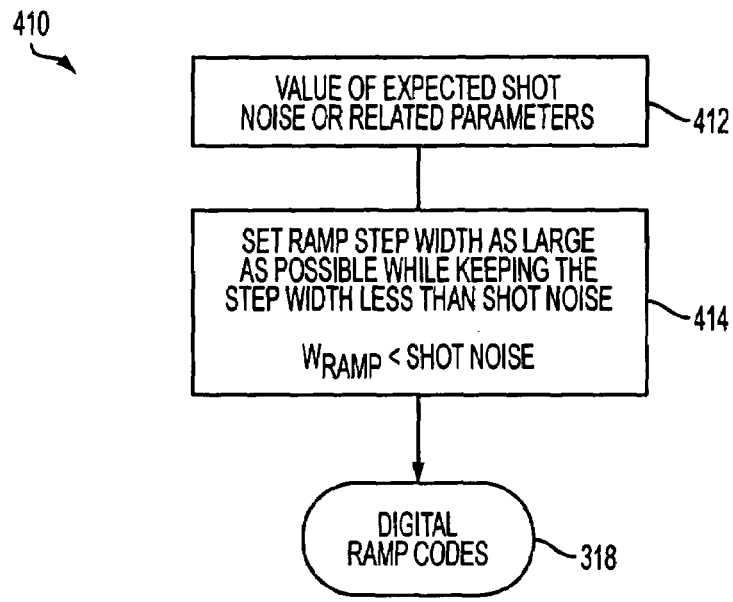
FIG. 17 illustrates processing performed by an exemplary ramp controller, used in the FIG. 16 converter, constructed in accordance with an embodiment of the invention.

FIG. 17 illustrates processing of an exemplary ramp controller 410, used in the FIG. 16 converter 350, constructed in accordance with an embodiment of the invention. The system controller 308 transfers expected shot noise values (or related information) to the ramp controller 410 (step 412). The ramp controller 410 constructs a ramp pattern in accordance with the principle that the ramp step width $W_{RAMP}$ is set as large as possible yet kept smaller than the estimated shot noise (step 414). Digital ramp codes are output to the analog ramp generator 302 and latch 360 (step 318).

The principle of the illustrated embodiment is now explained in more detail using the charge integration of a photodetector as an example. Shot noise is expressed as $\sqrt{N_{electron}}$, where $N_{electron}$ is the number of stored photo-generated charge carriers. Using a conversion factor, CG (V/electron), corresponding to the total analog chain from a photo detector node to the comparator input, assuming linear characteristics of the analog signal chain, input voltage and shot noise voltage are expressed as:

$$InputVoltage = CG \times N_{electron}, \quad (2)$$

$$ShotNoise = CG \times \sqrt{N_{electron}}. \quad (3)$$

The ramp controller 410 generates ramp codes with a variable ramp step width tracing the shot noise calculated in equation (3).

Figure 18:
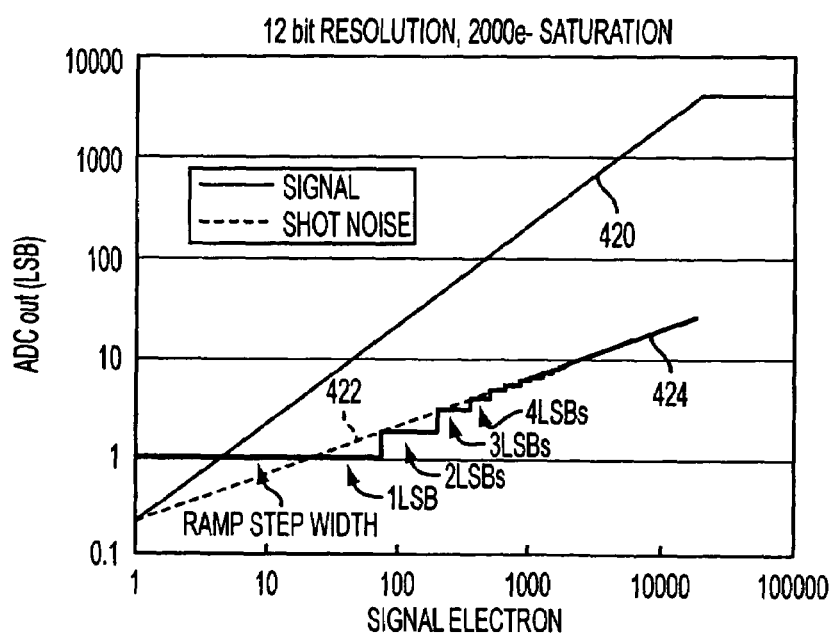
FIG. 18 is a graph illustrating ADC output v. signal electrons in accordance with the FIG. 17 embodiment.

An example of a ramp step pattern 424 is shown in FIG. 18 with 20 ke saturation and 12-bit ADC resolution. For exemplary purposes only, it is presumed that an ADC input window of 1 Vp-p (volt peak-to-peak) is used. The ramp 424 starts with a 1LSB step width, where 1LSB corresponds to a voltage step of 1/4096 V=244 uV. Shot noise 422 increases with the increase of the input signal 420. When the shot noise 422 value exceeds 2×244 uV=488 uV, the ramp step 424 width is changed to 2 LSBs. Similarly, the ramp step 424 width will be increased at every transient point, but as noted above, keeping the width smaller than the shot noise voltage 422.

Figure 19:
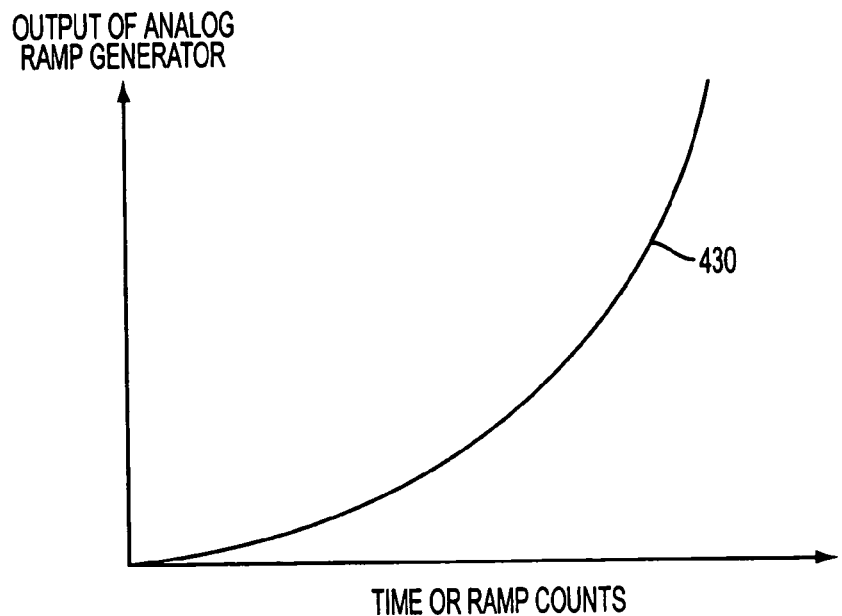
FIG. 19 is a graph illustrating the output of a ramp generator v. ramp counts in accordance with the FIG. 17 embodiment of the invention.

FIG. 19 is a graph of a line 430 that illustrates the behavior of generated ramp values versus ramp counts. It can be seen that: (1) when the signal level is small, the ADC performs in maximum data resolution (i.e., resolution is 1 LSB), which therefore doesn't affect the detectable limit for a small input signal; (2) when the signal level is large and shot noise is larger than the 12-bit resolution, the ramp step width is increased so that total number of ramp cycles can be substantially reduced; and (3) as the ramp step width is always smaller than shot noise, the contour-wise noise due to large ramp step widths is not visible. As a result, the increased step width doesn't affect image quality.

Figure 20:
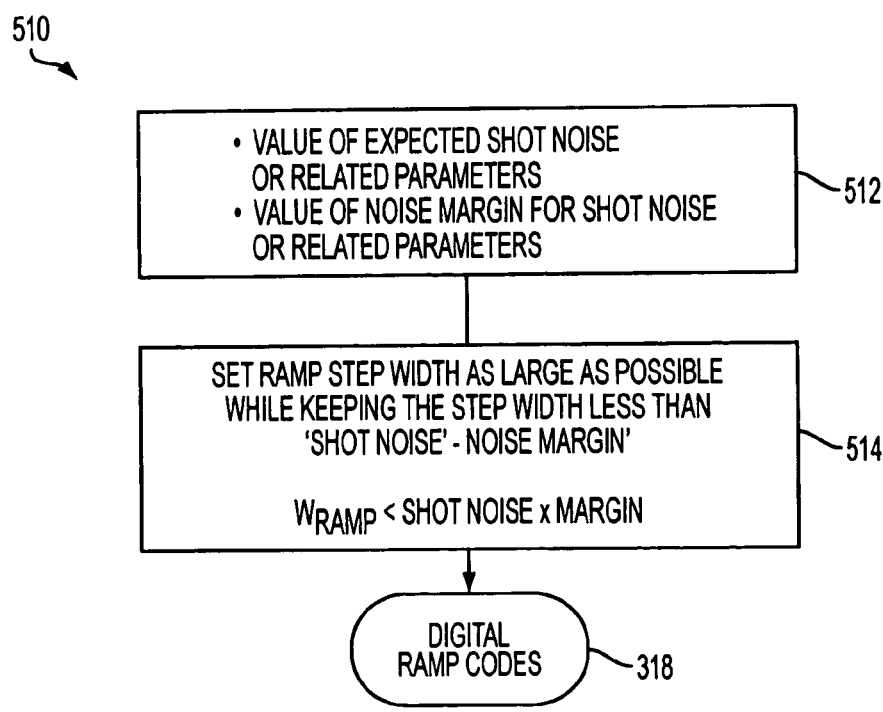
FIG. 20 illustrates processing performed by an exemplary ramp controller constructed in accordance with an embodiment of the invention.

FIG. 20 illustrates processing performed by an exemplary ramp controller 510 constructed in accordance with another embodiment of the invention. In order to make the analog-to-digital conversion process more flexible, another input parameter is implemented in this embodiment. The parameter determines the margin between the shot noise value and the ramp step width, which helps control the accuracy of the conversion. For example, when extreme accuracy is required, skipping ramp codes may affect data accuracy and should be limited. On the other hand, operation speed is typically more important than accuracy in many cases. This means that there are different preferences and thus, an inquiry regarding conversion accuracy versus operation speed is required; the additional parameter of the illustrated embodiment, can be used to control data accuracy depending upon the desired accuracy or speed.

The ramp controller 510 inputs a ramp pattern using an expected/estimated shot noise and a noise margin value (step 512). The controller 512 calculates (at step 514) the ramp step width as follows:

$$W_{RAMP} \leq (\text{Shot noise}) \times (\text{noise margin}). \quad (4)$$

Figure 21:
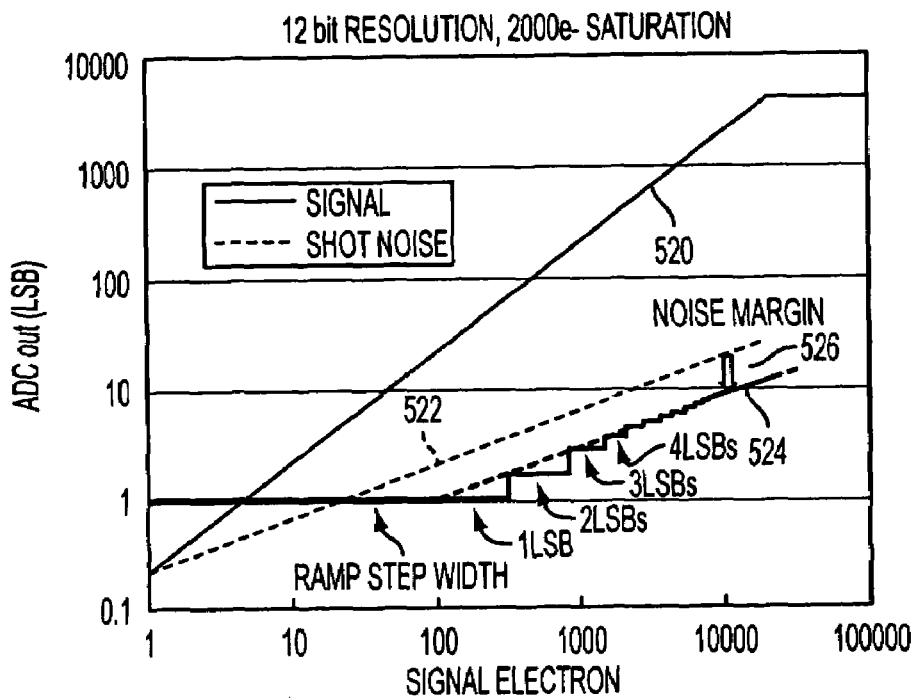
FIG. 21 is a graph illustrating ADC output v. signal electrons in accordance with the FIG. 20 embodiment of the invention.

It should be appreciated that using a noise margin less than 1 causes the ramp step width to become smaller than shot noise value; digital noise (or contour-wise noise) can be reduced and data accuracy is improved. For example, with a noise margin equal to 0.5, the digital contour component is reduced by half. FIG. 21 shows the difference between the present embodiment and the embodiment illustrated in FIG. 17 (which presumably has a noise margin set to 1). Line 520 represents the signal, line 522 represents shot noise, line 524 represents the ramp steps and line 526 represents the noise margin. When a faster operational speed is required, the noise margin is set to a value larger than 1, which reduces the total number of ramp steps and increases the speed of the conversion process.

Table I (below) illustrates the number of ramp steps required in one ADC period based on different noise margins. The table presumes a 12-bit analog-to-digital converter and saturation signal electrons of 20 ke (×1000 electrons). The conventional non-modulated ramp ADC requires 4096 steps. Using the present invention, the ramp step number is reduced to 3.6% for a noise margin equal to 2, 7.3% for a noise margin equal to 1, and 15% when the noise margin is 0.5.

TABLE I

| 12-bit ADC, saturation signal = 20 ke | Conventional Ramp | Ramp step width modulation | | |
|---|---|---|---|---|
| | | Noise margin = 2 (+6 dB) | Noise margin = 1 (0 dB) | Noise margin = 0.5 (−6 dB) |
| Ramp step number | 4096 | 149 | 297 | 607 |

Figure 22:
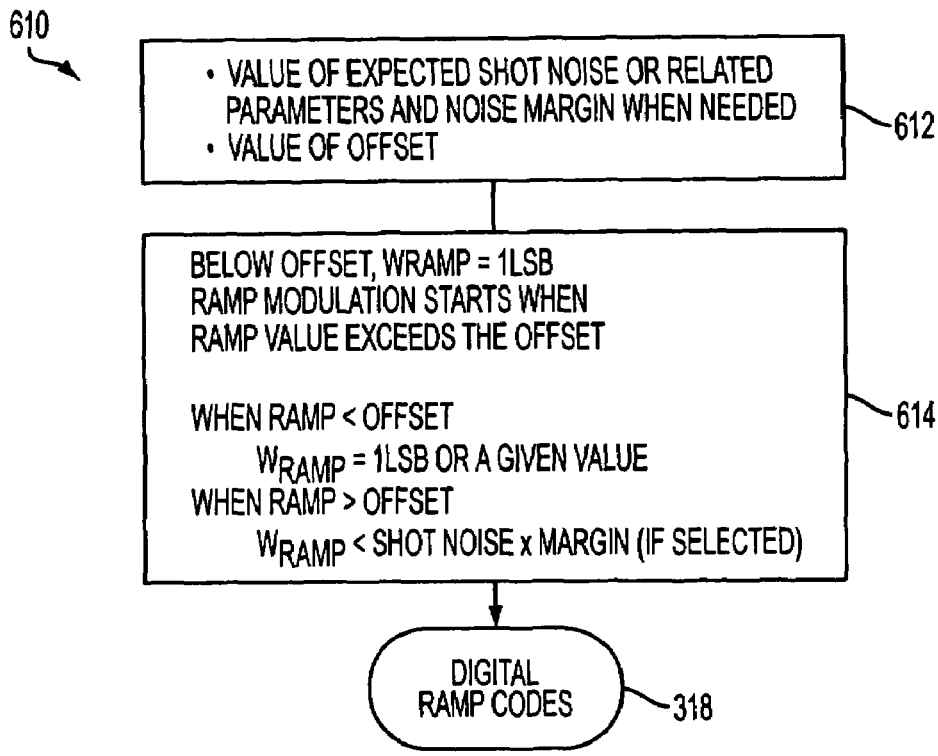
FIG. 22 illustrates processing performed by an exemplary ramp controller constructed in accordance with an embodiment of the invention.

FIG. 22 illustrates the processing performed by an exemplary ramp controller 610 constructed in accordance with another embodiment of the invention. The illustrated embodiment includes offset control in the ramp step width determination. In the illustrated embodiment, the ramp controller 610 generates a fixed ramp step width until reaching the input target offset value, then begins ramp step width modulation. The target offset value is input from the system controller 308 (step 612) along with the expected shot noise and noise margin (if desired). At step 614, the ramp step width is calculated as follows:

$$W_{RAMP} = 1 LSB, \text{ when } W_{RAMP} < \text{offset, or} \quad (5)$$

Figure 23:
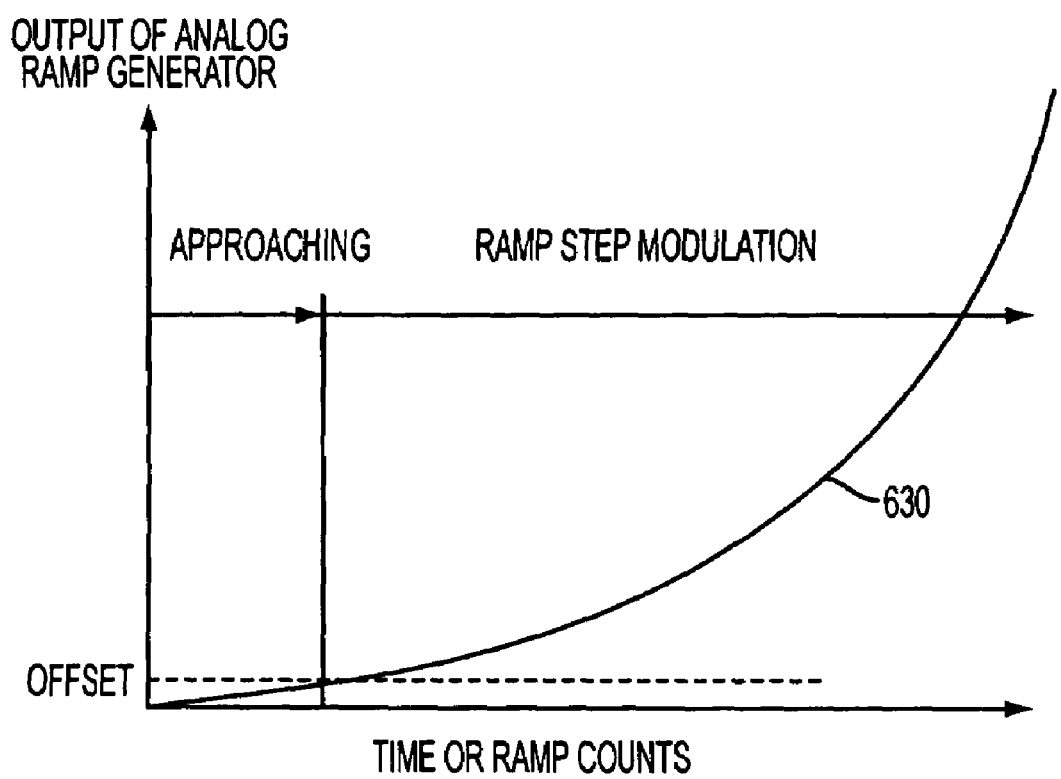
FIG. 23 is a graph illustrating the output of a ramp generator v. ramp counts in accordance with the FIG. 22 embodiment of the invention.

(6) $W_{RAMP} < (\text{Shot noise}) \times (\text{noise margin(if input)})$, when $W_{RAMP} > \text{offset}$. FIG. 23 is a graph of a line 630 illustrating the output of a ramp generator v. ramp counts in accordance with the FIG. 22 embodiment of the invention.

Figure 24:
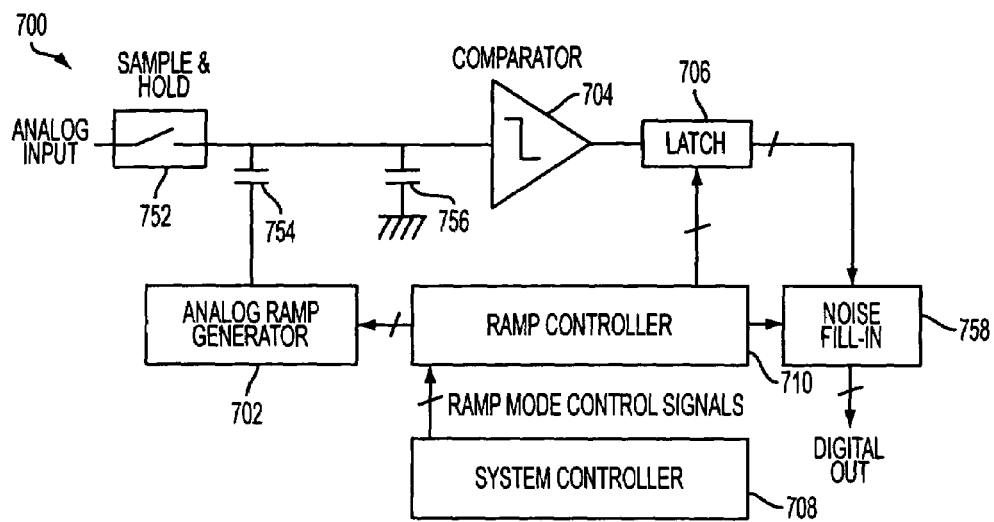
FIG. 24 illustrates another exemplary ramp modulation analog-to-digital converter constructed in accordance with another embodiment of the invention.

FIG. 24 illustrates another exemplary ramp modulation analog-to-digital converter 700 constructed in accordance with another embodiment of the invention. There is the possibility that there will be vacant bits in the digital output generated by the converters described above. By filling in the vacant bits with artificial noise, contour-wise noise is reduced. The converter 700 includes a sample and hold switch 752, sample and hold capacitor 754, capacitor 756, comparator 704, latch 706, analog ramp generator 702, system controller 708, ramp controller 710 and a noise fill-in block 758. The noise fill-in block 758 receives information relating to the ramp pattern and/or location of vacant bits, from the ramp controller 710, and adds the artificial noise into the digital data to fill in the vacant bits.

Figure 25:
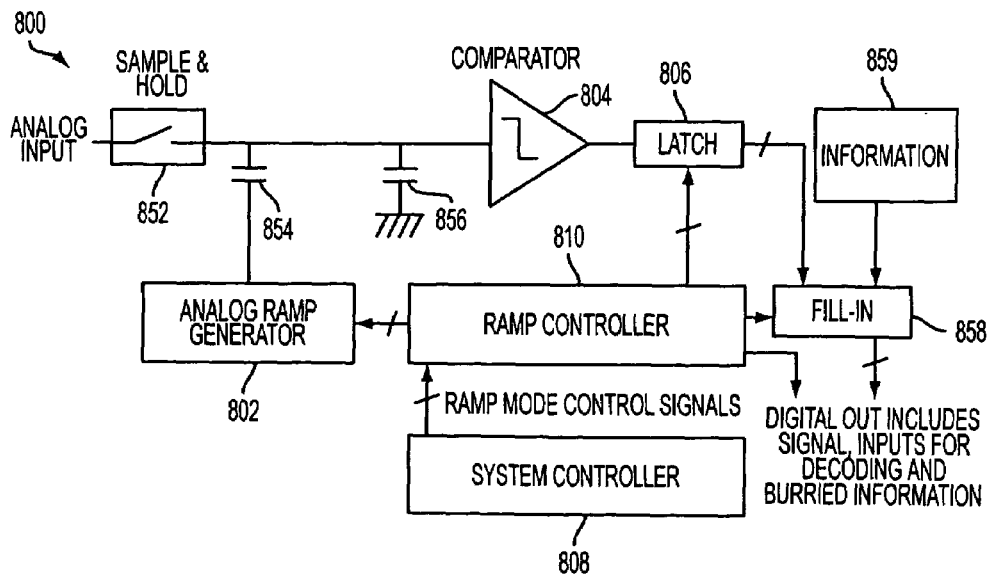
FIG. 25 illustrates another exemplary ramp modulation analog-to-digital converter constructed in accordance with another embodiment of the invention.

FIG. 25 illustrates another exemplary ramp modulation analog-to-digital converter 800 constructed in accordance with another embodiment of the invention. The converter 800 includes a sample and hold switch 852, sample and hold capacitor 854, capacitor 856, comparator 804, latch 806, analog ramp generator 802, system controller 808, ramp controller 810, noise fill-in block 858 and an information block 859. The illustrated embodiment fills vacant bits by inputting coded meaningful information, such as date of measurement, etc. and using the information in the fill-in block 858 to fill in the vacant bits of the output digital code.

Figure 26:
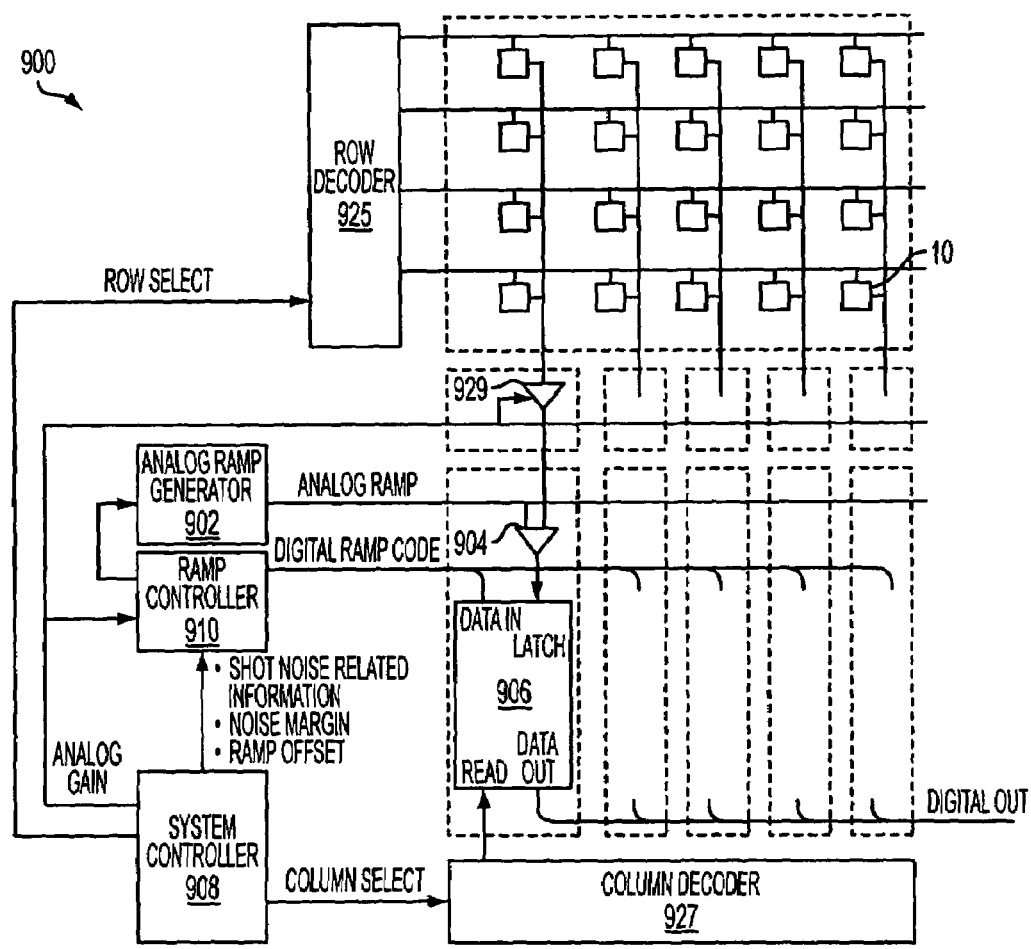
FIG. 26 illustrates an imager device incorporating an analog-to-digital converter constructed in accordance with any of the embodiments of the invention.

FIG. 26 illustrates an imaging device 900 incorporating analog-to-digital converters constructed in accordance with any of the above-described embodiments of the invention. The imager 900 includes an array of pixels 10, row decoder 925, column decoder 927, differential amplifiers 929 and a series of analog-to-digital converter circuits containing column-wise, comparators 904 and latches 906. The ADCs are implemented in parallel to obtain high speed performance and to achieve video signal frequency. The parallel ADCs are driven by a common analog ramp generator 902 and a common ramp controller 910. The analog ramp generator 902 and ramp controller 910 are controlled by a system controller 908. By using ramp step width modulation, low power and high performance analog-to-digital conversion can be realized in the imager 900.

FIG. 27 shows a system 1000, a typical processor system modified to include an imaging device 1008 (such as the imaging device 900 illustrated in FIG. 26) of the invention. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 1000, for example a camera system, generally comprises a central processing unit (CPU) 1002, such as a microprocessor, that communicates with an input/output (I/O) device 1006 over a bus 1020. Imaging device 1008 also communicates with the CPU 1002 over the bus 1020. The processor-based system 1000 also includes random access memory (RAM) 1004, and can include removable memory 1014, such as flash memory, which also communicate with the CPU 1002 over the bus 1020. The imaging device 1008 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An analog-to-digital converter comprising:
   a ramp generator;
   a control circuit connected to said ramp generator, said control circuit controlling said generator to output ramp modulated analog ramp outputs having a width correlated to photon shot noise, said control circuit generating a digital code corresponding to each analog ramp output; and
   a comparison circuit connected to receive an analog input signal and the analog ramp outputs, said comparison circuit generating a signal when the received analog input signal equals the analog ramp output, said digital code being used as an output of the converter.

2. The analog-to-digital converter of claim 1, wherein said control circuit comprises:
   a system controller adapted to receive and output conversion information; and
   a ramp controller connected to the system controller, said ramp controller determining a ramp mode from the output conversion information and using the ramp mode to generate a ramp pattern for controlling the generator.

3. The analog-to-digital converter of claim 2, wherein the conversion information comprises at least one of shot noise, noise margin and an offset value.

4. The analog-to-digital converter of claim 2, wherein the conversion information comprises estimated shot noise of the analog signal and said ramp controller calculates a ramp step width such that the width is less than the shot noise.

5. The analog-to-digital converter of claim 2, wherein the conversion information comprises estimated shot noise of the analog signal and a desired noise margin, said ramp controller calculates a ramp step width such that the width is less than the shot noise multiplied by the noise margin.

6. The analog-to-digital converter of claim 2, wherein the conversion information comprises estimated shot noise of the analog signal and an offset value, said ramp controller calculates a ramp step having a modulated width only when the width is greater than the offset.

7. The analog-to-digital converter of claim 6, wherein the ramp width is not modulated when the width is less than the offset.

8. The analog-to-digital converter of claim 1, wherein said comparison circuit further comprises:
   a dual input comparator, a first input being connected to the analog input signal and a second input being connected to the analog ramp output; and
   a latch for latching the digital code when the comparator detects that the analog input signal equals the analog ramp output.

9. An analog-to-digital converter comprising:
   a ramp generator,
   a control circuit connected to said ramp generator, said control circuit controlling said generator to output ramp modulated analog ramp outputs, said control circuit generating a digital code corresponding to each analog ramp output, and
   a comparison circuit connected to receive an analog input signal and the analog ramp outputs, said comparison circuit generating a signal when the received analog input signal equals the analog ramp output, said digital code being used as an output of the converter, wherein said comparison circuit further comprises:
   a sample and hold circuit connected to the analog input and the analog ramp output, said sample and hold circuit generating a voltage based on the difference between the analog input and the analog ramp output;
   a single input comparator connected to the voltage, said comparator generating a comparator signal when the voltage indicates that the analog input signal equals the analog ramp output; and
   a latch for latching the digital code when the comparator generates the comparator signal.

10. An analog-to-digital converter comprising:
   a ramp generator,
   a control circuit connected to said ramp generator, said control circuit controlling said generator to output ramp modulated analog ramp outputs, said control circuit generating a digital code corresponding to each analog ramp output, and
   a comparison circuit connected to receive an analog input signal and the analog ramp outputs, said comparison circuit generating a signal when the received analog input signal equals the analog ramp output, said digital code being used as an output of the converter, wherein the ramp generator comprises:
   a curve generator generating a ramp code;
   addressing circuitry for generating row and column addresses and a lock signal from said ramp code; and
   an array of unit cells, each cell having a voltage output, said array generating the analog ramp output based on the row and column addresses and the lock signal.

11. The analog-to-digital converter of claim 10, wherein the lock signal is used to activate an entire row of unit cells.

12. The analog-to-digital converter of claim 10, wherein said addressing circuitry comprises:
   a row/column transforming circuit, said transforming circuit generating the row and column addresses;
   a row decoder, said row decoder activating unit cells in a row corresponding to the row addresses, said row decoder generating the lock signal for a selected row after each cell in the selected row has been activated; and
   a column decoder, said column decoder activating cells in a column corresponding to the column addresses.

13. The analog-to-digital converter of claim 10 further comprising a switch connected to a combined output of the array of unit cells, said switch disconnecting the output of the array during a pedestal operation.

14. The analog-to-digital converter of claim 10, wherein each unit cell comprises:
   an AND gate having a first input connected to a column select signal and a second input connected to a row select signal;
   an OR gate having a first input connected to the lock signal and a second input connected to an output of the AND gate; and
   a voltage generating circuit coupled to an output of the OR gate.

15. The analog-to-digital converter of claim 10 further comprising a fill-in block for filling in vacant bits in the digital code.

16. A ramp generator for an analog-to-digital converter, said generator comprising:
   a curve generator generating a ramp code;
   addressing circuitry for generating row and column addresses and a lock signal from said ramp code; and
   an array of unit cells, each cell having a voltage output, said array generating an analog ramp output based on the row and column addresses and the lock signal.

17. The generator of claim 16, wherein the lock signal is used to activate an entire row of unit cells.

18. The generator of claim 16, wherein said addressing circuitry comprises:
- a row/column transforming circuit, said transforming circuit generating the row and column addresses;
- a row decoder, said row decoder activating unit cells in a row corresponding to the row addresses, said row decoder generating the lock signal for a selected row after each cell in the selected row has been activated; and
- a column decoder, said column decoder activating cells in a column corresponding to the column addresses.

19. The generator of claim 16 further comprising a switch connected to a combined output of the array of unit cells, said switch disconnecting the output of the array during a pedestal operation.

20. The generator of claim 16, wherein each unit cell comprises:
- an AND gate having a first input connected to a column select signal and a second input connected to a row select signal;
- an OR gate having a first input connected to the lock signal and a second input connected to an output of the AND gate; and
- a voltage generating circuit coupled to an output of the OR gate.

21. An imaging device comprising:
- an array of pixels, said array outputting analog signals; and
- a ramp modulation analog-to-digital converter, said analog-to-digital converter converting the analog signals to digital signals by generating ramp codes based on estimated shot noise and comparing ramp modulated outputs corresponding to the generated ramp codes to the analog signals.

22. The device of claim 21, wherein said analog-to-digital converter comprises:
- a ramp generator;
- a control circuit connected to said ramp generator, said control circuit controlling said generator to output the ramp modulated analog ramp outputs, said control circuit generating the ramp codes corresponding to each analog ramp output; and
- a comparison circuit connected to receive the analog signals and the analog ramp outputs, said comparison circuit generating a signal when an analog signal equals the analog ramp output, said ramp code being used as an output of the converter.

23. The device of claim 22, wherein said control circuit comprises:
- a system controller adapted to receive and output conversion information; and
- a ramp controller connected to the system controller, said ramp controller determining a ramp mode from the output conversion information and using the ramp mode to generate a ramp pattern for controlling the generator.

24. The device of claim 23, wherein the conversion information comprises at least one of shot noise, noise margin and an offset value.

25. The device of claim 23, wherein the conversion information comprises estimated shot noise of the analog signal and said ramp controller calculates a ramp step width such that the width is less than the shot noise.

26. The device of claim 23, wherein the conversion information comprises estimated shot noise of the analog signal and a desired noise margin, said ramp controller calculates a ramp step width such that the width is less than the shot noise multiplied by the noise margin.

27. The device of claim 23, wherein the conversion information comprises estimated shot noise of the analog signal and an offset value, said ramp controller calculates a ramp step having a modulated width only when the width is greater than the offset.

28. The device of claim 27, wherein the ramp width is not modulated when the width is less than the offset.

29. An imaging device comprising:
- an array of pixels, said array outputting analog signals, and
- a ramp modulation analog-to-digital converter, said analog-to-digital converter converting the analog signals to digital signals, said analog-to-digital converter comprising:
  - a ramp generator;
  - a control circuit connected to said ramp generator, said control circuit controlling said generator to output ramp modulated analog ramp outputs, said control circuit generating a digital code corresponding to each analog ramp output; and
  - a comparison circuit connected to receive the analog signals and the analog ramp outputs, said comparison circuit generating a signal when an analog signal equals the analog ramp output, said digital code being used as an output of the converter,
wherein said comparison circuit further comprises:
- a dual input comparator, a first input being connected to the analog input signal and a second input being connected to the analog ramp output; and
- a latch for latching the digital code when the comparator detects that the analog input signal equals the analog ramp output.

30. An imaging device comprising:
- an array of pixels, said array outputting analog signals, and
- a ramp modulation analog-to-digital converter, said analog-to-digital converter converting the analog signals to digital signals, said analog-to-digital converter comprising:
  - a ramp generator;
  - a control circuit connected to said ramp generator, said control circuit controlling said generator to output ramp modulated analog ramp outputs, said control circuit generating a digital code corresponding to each analog ramp output; and
  - a comparison circuit connected to receive the analog signals and the analog ramp outputs, said comparison circuit generating a signal when an analog signal equals the analog ramp output, said digital code being used as an output of the converter,
wherein said comparison circuit further comprises:
- a sample and hold circuit connected to the analog input and the analog ramp output, said sample and hold circuit generating a voltage based on the difference between the analog input and the analog ramp output;
- a single input comparator connected to the voltage, said comparator generating a comparator signal when the voltage indicates that the analog input signal equals the analog ramp output; and
- a latch for latching the digital code when the comparator generates the comparator signal.

31. An imaging device comprising:
- an array of pixels, said array outputting analog signals, and a ramp modulation analog-to-digital converter, said analog-to-digital converter converting the analog signals to digital signals, said analog-to-digital converter comprising:
  a ramp generator:
  a control circuit connected to said ramp generator, said control circuit controlling said generator to output ramp modulated analog ramp outputs, said control circuit generating a digital code corresponding to each analog ramp output; and
  a comparison circuit connected to receive the analog signals and the analog ramp outputs, said comparison circuit generating a signal when an analog signal equals the analog ramp output, said digital code being used as an output of the converter,
wherein the ramp generator comprises:
a curve generator generating a ramp code;
addressing circuitry for generating row and column addresses and a lock signal from said ramp code; and
an array of unit cells, each cell having a voltage output, said array generating the analog ramp output based on the row and column addresses and the lock signal.

32. The device of claim 31, wherein the lock signal is used to activate an entire row of unit cells.

33. The device of claim 31, wherein said addressing circuitry comprises:
  a row/column transforming circuit, said transforming circuit generating the row and column addresses;
  a row decoder, said row decoder activating unit cells in a row corresponding to the row addresses, said row decoder generating the lock signal for a selected row after each cell in the selected row has been activated; and
  a column decoder, said column decoder activating cells in a column corresponding to the column addresses.

34. The device of claim 31 further comprising a switch connected to a combined output of the array of unit cells, said switch disconnecting the output of the array during a pedestal operation.

35. The device of claim 31, wherein each unit cell comprises:
  an AND gate having a first input connected to a column select signal and a second input connected to a row select signal;
  an OR gate having a first input connected to the lock signal and a second input connected to an output of the AND gate; and
  a voltage generating circuit coupled to an output of the OR gate.

36. A processor system comprising:
  an imaging device comprising an array of pixels, said array outputting analog signals; and a ramp modulation analog-to-digital converter, said analog-to-digital converter converting the analog signals to digital signals by generating ramp codes based on estimated shot noise and comparing ramp output signals corresponding to the generated ramp codes to the analog signals.

37. A method of operating a ramp generator for an analog-to-digital converter, said method comprising the steps of:
  generating a digital ramp code based on a desired square root curve;
  generating row and column addresses from the digital ramp code;
  activating unit cells in a unit cell array with the row and column addresses; and
  locking a row of unit cells when every unit cell in a selected row has been activated, wherein a combined voltage output of the activated and locked unit cells is used as a ramp modulated output of the generator.

38. The method of claim 37 wherein the desired square root curve compensates for estimated shot noise typically associated with an analog signal.

39. The method of claim 37 further comprising the act of switching out the output of the generator during a predetermined operation.

40. The method of claim 39 wherein the predetermined operation is a pedestal operation.

41. A method of operating a ramp generator in an analog-to-digital converter, said method comprising the acts of:
  inputting ramp mode control signals, said ramp mode control signals comprising estimated shot noise;
  selecting a ramp mode based on the control signals;
  determining a ramp pattern based on the ramp mode; and
  outputting a code to the generator such that the generator generates a ramp modulated output signal.

42. The method of claim 41, further comprising the act of:
  generating a ramp step width that is no larger than the shot noise.

43. The method of claim 41, further comprising the acts of:
  inputting a noise margin; and
  generating a ramp step width that is no larger than the shot noise multiplied by the noise margin.

44. The method of claim 41, further comprising the acts of:
  inputting an offset value;
  generating a ramp step width that is not modulated when the width is less than the offset value; and
  generating a ramp step width that is modulated when the width is more than the offset value.

45. The method of claim 41, further comprising the act of filling in vacant bits of the code.

46. A method of operating an analog-to-digital converter, said method comprising the steps of:
  generating a digital ramp code based on a desired square root curve;
  generating row and column addresses from the digital ramp code;
  activating unit cells in a unit cell array with the row and column addresses;
  locking a row of unit cells when every unit cell in a selected row has been activated, a combined voltage output of the activated and locked unit cells being used as a ramp modulated output;
  comparing an input analog signal to the ramp modulated output; and
  outputting the digital ramp code when the ramp modulated output reaches the input analog signal.

47. The method of claim 46, wherein the desired square root curve compensates for estimated shot noise typically associated with the analog signal.

48. The method of claim 46 further comprising the act of switching out the output of the generator during a predetermined operation.

49. The method of claim 46 wherein the predetermined operation is a pedestal operation.

50. A method of operating an analog-to-digital converter, said method comprising the acts of:
inputting ramp mode control signals, said ramp mode control signals comprising estimated shot noise;
selecting a ramp mode based on the control signals;
determining a ramp pattern based on the ramp mode;
outputting a code to the generator such that the generator generates a ramp modulated output signal;
comparing an input analog signal to the ramp modulated output; and
outputting the code when the ramp modulated output reaches the input analog signal.

51. The method of claim 50, further comprising the act of:
generating a ramp step width that is no larger than the shot noise.

52. The method of claim 50, further comprising the acts of:
inputting a noise margin; and
generating a ramp step width that is no larger than the shot noise multiplied by the noise margin.

53. The method of claim 50, further comprising the acts of:
inputting an offset value;
generating a ramp step width that is not modulated when the width is less than the offset value; and
generating a ramp step width that is modulated when the width is more than the offset value.

54. The method of claim 50, further comprising the act of filling in vacant bits of the code.

* * * * *